(12) United States Patent
Nagayama

(10) Patent No.: US 8,463,202 B2
(45) Date of Patent: *Jun. 11, 2013

(54) POWER AMPLIFYING CIRCUIT, AND TRANSMITTER AND WIRELESS COMMUNICATION DEVICE USING THE SAME

(75) Inventor: Akira Nagayama, Tokyo (JP)

(73) Assignee: Kyocera Corporation, Kyoto (JP)

(*) Notice: Subject to any disclaimer, the term of this patent is extended or adjusted under 35 U.S.C. 154(b) by 422 days.

This patent is subject to a terminal disclaimer.

(21) Appl. No.: 12/679,896

(22) PCT Filed: Apr. 1, 2008

(86) PCT No.: PCT/JP2008/056457
§ 371 (c)(1),
(2), (4) Date: Jun. 7, 2010

(87) PCT Pub. No.: WO2009/041096
PCT Pub. Date: Apr. 2, 2009

(65) Prior Publication Data
US 2010/0240331 A1  Sep. 23, 2010

(30) Foreign Application Priority Data

Sep. 27, 2007 (JP) ................................ 2007-251577
Jan. 31, 2008 (JP) ................................ 2008-022160

(51) Int. Cl.
*H04B 1/04* (2006.01)
*H01Q 11/12* (2006.01)

(52) U.S. Cl.
USPC .......... 455/91; 455/108; 455/110; 455/127.1; 455/127.3

(58) Field of Classification Search
USPC .......... 455/91, 108, 110, 114.2–114.3, 115.1, 455/127.1–127.5; 375/295–298
See application file for complete search history.

(56) References Cited

U.S. PATENT DOCUMENTS

| 5,287,069 A | 2/1994 | Okubo et al. |
| 6,737,914 B2 * | 5/2004 | Gu .................................... 330/2 |

(Continued)

FOREIGN PATENT DOCUMENTS

| JP | 03-232307 | 10/1991 |
| JP | 05-037263 | 2/1993 |

(Continued)

OTHER PUBLICATIONS

International Search Report for PCT/JP2008/056457, mailed on Jun. 24, 2008, 2 pages.

(Continued)

*Primary Examiner* — Simon Nguyen
(74) *Attorney, Agent, or Firm* — Duane Morris LLP

(57) ABSTRACT

To provide a power amplifier circuit which is capable of reducing a phase error of an output signal in a case where an amplitude of an input signal is relatively small, as well as a transmitter and a wireless communication device using the same. A constant envelope signal generation circuit (20) converts an input signal (Si) having envelope variation into a first constant envelope signal (Sd1) and a second constant envelope signal (Sd2) having the same amplitude and different phases, and outputs the signals. A first amplifier (11) amplifies the first constant envelope signal (Sd1). A second amplifier (12) amplifies the second constant envelope signal (Sd2). An output adder (13) outputs an amplified output signal having envelope variation based on the amplified signals output from the first amplifier (11) and the second amplifier (12). An amplitude control circuit (reference potential control circuit (45)) controls the amplitude of the first constant envelope signal (Sd1) and the second constant envelope signal (Sd2) based on the amplitude of the input signal (Si).

9 Claims, 13 Drawing Sheets

U.S. PATENT DOCUMENTS

| | | | |
|---|---|---|---|
| 6,825,719 B1 * | 11/2004 | Barak et al. | 330/129 |
| 7,196,578 B2 * | 3/2007 | Kermalli | 330/124 R |
| 7,369,822 B2 * | 5/2008 | Loraine et al. | 455/127.3 |
| 7,570,711 B1 * | 8/2009 | Chavez et al. | 375/298 |
| 7,715,493 B2 * | 5/2010 | Ravi et al. | 375/296 |
| 7,724,839 B2 * | 5/2010 | Chen et al. | 375/296 |
| 7,742,541 B2 * | 6/2010 | Matsuura et al. | 375/297 |
| 7,889,811 B2 * | 2/2011 | Byun et al. | 375/297 |
| 7,953,378 B2 * | 5/2011 | Saed | 455/114.3 |
| 7,957,712 B2 * | 6/2011 | Sjoland | 455/127.3 |
| 8,059,749 B2 * | 11/2011 | Sorrells et al. | 375/297 |
| 2003/0222709 A1 * | 12/2003 | Kim | 330/51 |

FOREIGN PATENT DOCUMENTS

| | | |
|---|---|---|
| JP | 06-022302 | 1/1994 |
| JP | 2003-298361 | 10/2003 |
| JP | 2004-343665 | 12/2004 |
| JP | 2006-270882 | 10/2006 |
| JP | 2006-333167 | 12/2006 |
| JP | 2006-339888 | 12/2006 |
| WO | WO-2004/077662 | 9/2004 |

OTHER PUBLICATIONS

Supplementary European Search Report for EP Application No. 08 73 9570, mailed on Oct. 29, 2010, 6 pages.

Jheng et al., IEEE Workshop on Signal Processing Systems (2007) pp. 31-34.

Chen et al., IEEE International Symposium on VLSI Design, Automation and Test (2007) pp. 1-4.

* cited by examiner

POWER AMPLIFYING CIRCUIT, AND TRANSMITTER AND WIRELESS COMMUNICATION DEVICE USING THE SAME

CROSS-REFERENCE TO RELATED APPLICATIONS

This is a U.S. National Phase Application of International Application No. PCT/JP2008/056457 filed Apr. 1, 2008, which claims priority to Japanese Patent Application Nos. 2007-251577 filed Sep. 27, 2007 and 2008-022160 filed Jan. 31, 2008, the disclosures of which are incorporated herein by reference in their entirety.

TECHNICAL FIELD

The present invention relates to a power amplifier circuit which is used for amplifying a transmission signal in a wireless communication device or the like, and more particularly, to a power amplifier circuit which is capable of amplifying a signal having envelope variation with high power added efficiency and exhibits low power consumption, and a transmitter and a wireless communication device using the same.

BACKGROUND ART

In wireless communication such as in a wireless network, a digital modulated signal is used for communication in many cases. Most of the signals used for such communication are signals with envelope variation because information is superimposed on the signal in the amplitude direction. Therefore, the wireless communication device that is used for the communication is required to amplify the signal having envelope variation. On the other hand, such wireless communication device is required to have low power consumption so as to secure communication time. The amplifier for amplifying the communication signal is also required to have low power consumption and high power added efficiency. However, there is a problem in that if the above-mentioned signal having envelope variation is amplified by a nonlinear amplifier having high power added efficiency, a distortion is generated and hence the signal is deteriorated. There are proposed some methods for amplifying the signal having envelope variation with high power added efficiency.

As one of the methods, there is an amplification method called a LINC (Linear amplification with Nonlinear Component) method. In this method, the signal with envelope variation is converted into two constant envelope signals, and each of the two constant envelope signals is amplified by using a nonlinear amplifier. Then, vector addition of the two amplified constant envelope signals is performed so that the amplified signal with envelope variation is generated. Thus, the signal with envelope variation may be amplified with high power added efficiency (see, for example, Patent Document 1).

Patent Document 1: JP 06-22302 B

DISCLOSURE OF THE INVENTION

Problems to be Solved by the Invention

In the power amplifier circuit as described above, if an amplitude difference occurs between two constant envelope signals, a phase difference may occur between the input signal and the amplified signal (output signal) obtained by vector addition of two constant envelope signals. This phase error increases as the phase difference between the two constant envelope signals increases. In other words, if a phase difference between the two constant envelope signals is relatively large, a phase error of the output signal becomes relatively large even if the amplitude difference between the constant envelope signals is relatively small. In addition, a phase difference between the two constant envelope signals increases as the amplitude of the input signal decreases. Therefore, if the amplitude of the input signal is relatively small, a phase error of the output signal becomes relatively large. Therefore, it is necessary to solve the problem that the phase error described above should be reduced in a case of amplifying the signal following a modulation method with large dynamic range.

The present invention has been made in view of the above-mentioned problem, and an object thereof is to provide a power amplifier circuit that is capable of reducing a phase error of an output signal in a case where an amplitude of the input signal is relatively small, as well as a transmitter and a wireless communication device using the same.

Means for Solving the Problems

In order to solve the above-mentioned problem, a power amplifier circuit according to the present invention includes: a constant envelope signal generation circuit for converting an input signal having envelope variation into a first constant envelope signal and a second constant envelope signal which have the same amplitude and different phases so as to output the first constant envelope signal and the second constant envelope signal; a first amplifier for amplifying the first constant envelope signal, which is input from the constant envelope signal generation circuit, so as to output a first amplified signal; a second amplifier for amplifying the second constant envelope signal, which is input from the constant envelope signal generation circuit, so as to output a second amplified signal; and an output adder for outputting an amplified output signal having envelope variation based on the first amplified signal, which is input from the first amplifier, and the second amplified signal, which is input from the second amplifier, in which the constant envelope signal generation circuit includes an amplitude control circuit for controlling the amplitude of the first constant envelope signal and the second constant envelope signal based on an amplitude of the input signal.

Further, in one aspect of the present invention, the amplitude control circuit may control the amplitude of the first constant envelope signal and the second constant envelope signal so that the amplitude of the first constant envelope signal and the second constant envelope signal decreases step by step as the amplitude of the input signal decreases.

Further, in one aspect of the present invention, the constant envelope signal generation circuit may include: a fundamental signal generation circuit for generating a first fundamental signal and a second fundamental signal having the same amplitude and predetermined phase relationships with the input signal, and a fundamental signal for conversion having constant phase relationships with the first fundamental signal and the second fundamental signal, from the input signal having envelope variation; a converted signal generation circuit for generating a first converted signal which has an amplitude Y satisfying $Y^2=A^2-X^2$, where X denotes the amplitude of the first fundamental signal and the second fundamental signal, and A denotes any constant amplitude larger than X, and which is advanced in phase with respect to the first fundamental signal by $\pi/2$, and a second converted signal which has the amplitude Y and is delayed in phase with respect to the second fundamental signal by $\pi/2$, by amplifying the fundamental signal for conversion based on the amplitude X of the first fundamental signal and/or the second fundamental signal; a first adder for performing vector addition of the first fundamental signal and the first converted signal; and a second adder for performing vector addition of the second fundamental signal and the second converted signal, the first constant envelope signal may be output based on a signal output from the first adder, and the second constant envelope signal may be output based on a signal output from the second adder, and the amplitude control circuit may control a gain of generating the first converted signal and the second converted signal, so as to control the amplitude of the first constant envelope signal and the second constant envelope signal.

Further, in one aspect of the present invention, the converted signal generation circuit may include: an amplitude detection signal generation circuit for generating an amplitude detection signal having a DC voltage α corresponding to an amplitude of a signal obtained by vector addition of the first fundamental signal and the first converted signal, and a signal obtained by vector addition of the second fundamental signal and the second converted signal; a subtractor for outputting, in a case where a reference signal having any DC voltage β larger than the DC voltage α and the amplitude detection signal are input, a signal having a DC voltage γ satisfying γ=β−α; and a variable gain amplifier for amplifying the fundamental signal for conversion based on a gain control signal based on the signal output from the subtractor so that the amplitude Y of the first converted signal and the second converted signal satisfies $Y^2=A^2-X^2$, and the amplitude control circuit may control the DC voltage β of the reference signal based on the amplitude of the input signal so as to control the amplitude of the first constant envelope signal and the second constant envelope signal.

Further, in one aspect of the present invention, the power amplifier circuit may further include a circuit for controlling the first amplifier and the second amplifier, in synchronization with a variation of the amplitude of the first constant envelope signal and the second constant envelope signal, so that an operating point of amplifying the first constant envelope signal and the second constant envelope signal is in a saturation region.

In addition, a power amplifier circuit according to the present invention includes: a constant envelope signal generation circuit for converting an input signal having envelope variation into a first constant envelope signal and a second constant envelope signal which have the same amplitude and different phases so as to output the first constant envelope signal and the second constant envelope signal; a first amplifier for amplifying the first constant envelope signal, which is input from the constant envelope signal generation circuit, so as to output a first amplified signal; a second amplifier for amplifying the second constant envelope signal, which is input from the constant envelope signal generation circuit, so as to output a second amplified signal; and an output adder for outputting an amplified output signal having envelope variation, which is obtained by vector addition of the first amplified signal, which is input from the first amplifier, and the second amplified signal, which is input from the second amplifier, in which the constant envelope signal generation circuit may include: a power distributor for generating a first distributed signal and a second distributed signal having the same amplitude and the same phase, and a distributed signal for conversion having constant phase relationships with the first distributed signal and the second distributed signal, from the input signal having envelope variation; a converted signal generation circuit for generating a first converted signal which has an amplitude Y satisfying $Y^2=A^2-X^2$, where X denotes the amplitude of the first distributed signal and the second distributed signal, and A denotes any constant amplitude larger than X, and which is advanced in phase with respect to the first distributed signal and the second distributed signal by $\pi/2$, and a second converted signal which has the amplitude Y and is delayed in phase with respect to the first distributed signal and the second distributed signal by $\pi/2$, from the distributed signal for conversion; a first adder for performing vector addition of the first distributed signal and the first converted signal so as to generate the first constant envelope signal; and a second adder for performing vector addition of the second distributed signal and the second converted signal so as to generate the second constant envelope signal.

In addition, in the above-mentioned structure of the power amplifier circuit according to the present invention, the converted signal generation circuit may include: a phase shifting circuit for changing a phase of the distributed signal for conversion so as to generate a first converted signal advanced in phase with respect to the first distributed signal, and the second distributed signal by $\pi/2$ and a second converted signal delayed in phase with respect to the first distributed signal and the second distributed signal by $\pi/2$; and a conversion distributed signal amplifier circuit for amplifying the distributed signal for conversion, in accordance with the amplitude X of the first distributed signal and the second distributed signal, so that the amplitude Y of the first converted signal and the second converted signal satisfies $Y^2=A^2-X^2$.

Further, in the above-mentioned structure of the power amplifier circuit according to the present invention, the conversion distributed signal amplifier circuit may include: an amplitude detection signal generation circuit for generating an amplitude detection signal having a DC voltage α which is proportional to the amplitude of the first constant envelope signal and the second constant envelope signal; a subtractor for outputting, in a case where a reference signal having any DC voltage β larger than the DC voltage α and the amplitude detection signal are input, a gain control signal having a DC voltage γ satisfying γ=β−α; and a variable gain amplifier for amplifying the distributed signal for conversion, based on the gain control signal, so that the amplitude Y of the first converted signal and the second converted signal satisfies $Y^2=A^2-X^2$.

Still further, in the above-mentioned structure of the power amplifier circuit according to the present invention, the amplitude detection signal generation circuit may input to a mixer two in-phase signals having an amplitude which is proportional to the amplitude of the first constant envelope signal or the second constant envelope signal, and uses an output signal from the mixer for generating the amplitude detection signal, the output signal containing a DC voltage component which is proportional to the amplitude of the first constant envelope signal or the second constant envelope signal.

A transmitter according to the present invention includes a transmission circuit and an antenna which are connected via the power amplifier circuit having one of the above-mentioned structures.

Further, a wireless communication device according to the present invention includes a transmission circuit and an antenna which are connected via the power amplifier circuit having one of the above-mentioned structures, and a reception circuit connected to the antenna.

Effects of the Invention

According to the present invention, the phase error of the output signal can be reduced in the case where the amplitude of the input signal is relatively small.

BEST MODE FOR CARRYING OUT THE INVENTION

Hereinafter, a power amplifier circuit according to an embodiment of the present invention is described in detail with reference to the attached drawings.

[Example 1 of Embodiment]

Figure 1:
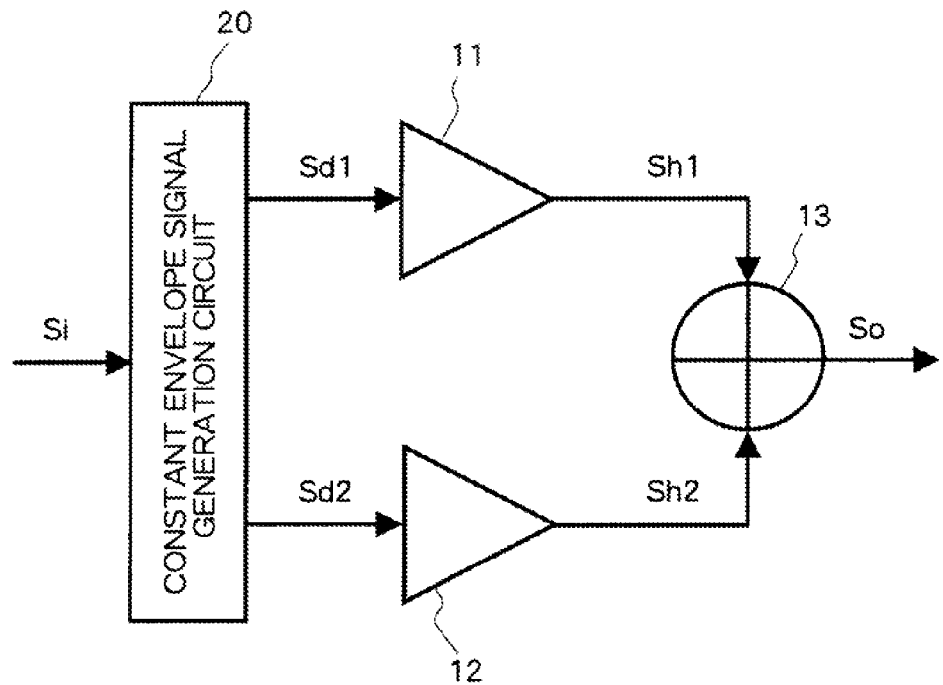
FIG. 1 is a block diagram illustrating schematically an example of a power amplifier circuit according to an embodiment of the present invention.
Figure 2:
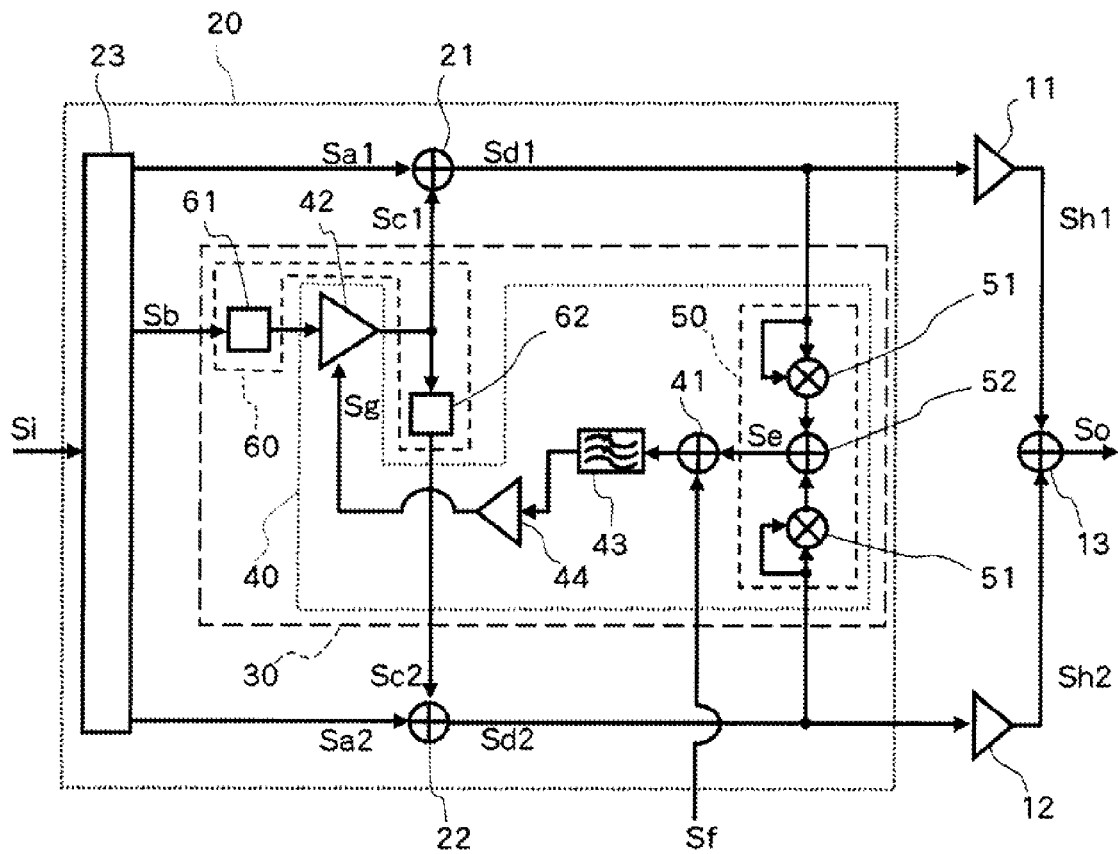
FIG. 2 is a circuit diagram illustrating schematically an example of the power amplifier circuit according to the embodiment of the present invention.
Figure 3:
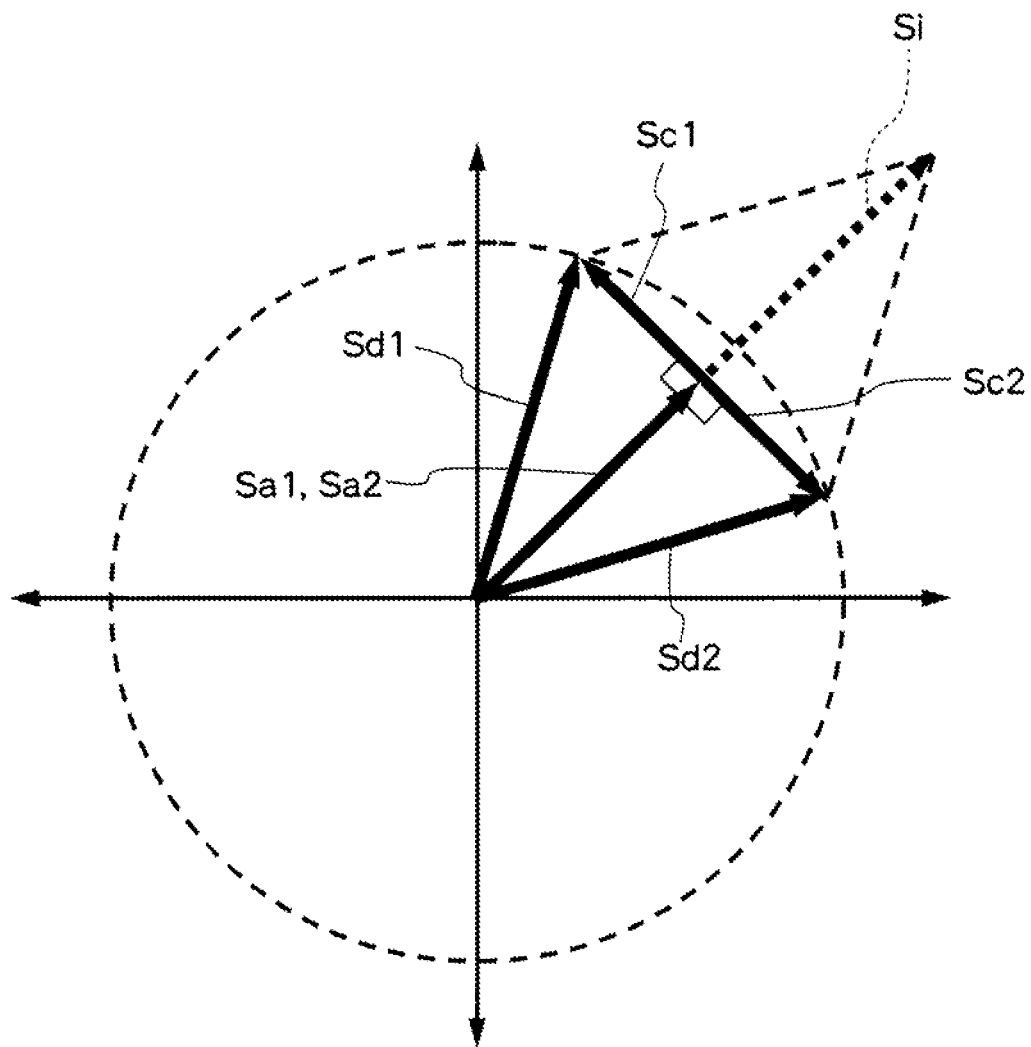
FIG. 3 is a vector diagram describing a basic principle of generation of a constant envelope signal in the power amplifier circuit according to the embodiment of the present invention.
Figure 4:
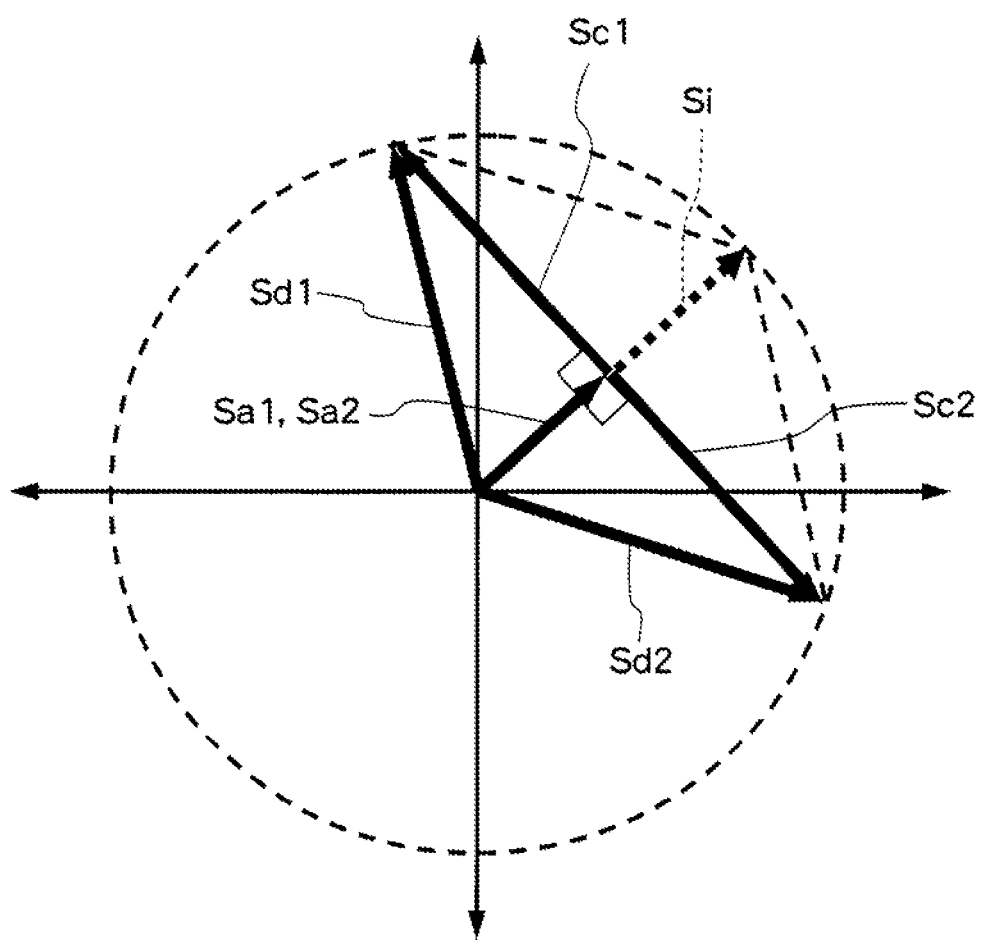
FIG. 4 is a vector diagram describing the basic principle of generation of the constant envelope signal in the power amplifier circuit according to the embodiment of the present invention.

FIGS. 1 and 2 are a block diagram and a circuit diagram illustrating an example of the power amplifier circuit according to the embodiment of the present invention. FIGS. 3 and 4 are diagrams for describing a mechanism of converting a varying envelope signal into two constant envelope signals in a constant envelope signal generation circuit of the power amplifier circuit according to this embodiment.

As illustrated in FIG. 1, the power amplifier circuit according to this embodiment includes a constant envelope signal generation circuit 20, a first amplifier 11, a second amplifier 12, and an output adder 13. The constant envelope signal generation circuit 20 converts an input signal Si with envelope variation into a first constant envelope signal Sd1 and a second constant envelope signal Sd2 which have the same amplitude and different phases, and outputs the signals. The first amplifier 11 amplifies the first constant envelope signal Sd1 supplied from the constant envelope signal generation circuit 20 and outputs a first amplified signal Sh1. The second amplifier 12 amplifies the second constant envelope signal Sd2 supplied from the constant envelope signal generation circuit 20 and outputs a second amplified signal Sh2. The output adder 13 performs vector addition of the first amplified signal Sh1 supplied from the first amplifier 11 and the second amplified signal Sh2 supplied from the second amplifier 12 so as to output an output signal So which is an amplified high frequency signal with envelope variation.

Further, as illustrated in FIG. 2, the constant envelope signal generation circuit 20 of the power amplifier circuit of this example includes a power distributor 23, a converted signal generation circuit 30, a first adder 21, and a second adder 22. The constant envelope signal generation circuit 20 generates, from the input signal Si having envelope variation, a first fundamental signal Sa1 and a second fundamental signal Sa2 which have the same amplitude and predetermined phase relationships with the input signal Si, and a fundamental signal for conversion Sb having constant phase relationships with the first fundamental signal and the second fundamental signal. In the constant envelope signal generation circuit 20 illustrated in FIG. 2, the power distributor 23 (fundamental signal generation circuit) generates, from the input signal Si having envelope variation, the first distributed signal and the second distributed signal having the same amplitude and the same phase, and the distributed signal for conversion having constant phase relationships with the first distributed signal and the second distributed signal. Then, the first distributed signal, the second distributed signal, and the distributed signal for conversion are used as the first fundamental signal Sa1, the second distributed signal Sa2, and the distributed signal for conversion Sb, respectively. The converted signal generation circuit 30 generates a first converted signal Sc1 which has an amplitude Y satisfying $Y^2 = A^2 - X^2$ (X denotes an amplitude of the first fundamental signal Sa1 and the second fundamental signal Sa2, and A denotes any constant amplitude larger than X) and is advanced in phase with respect to the first fundamental signal Sa1 by $\pi/2$, and a second converted signal Sc2 which has the amplitude Y and is delayed in phase with respect to the second fundamental signal Sa2 by $\pi/2$, based on the fundamental signal for conversion Sb. The first adder 21 performs vector addition of the first fundamental signal Sa1 and the first converted signal Sc1. The second adder 22 performs vector addition of the second fundamental signal Sa2 and the second converted signal Sc2. The constant envelope signal generation circuit 20 outputs the first constant envelope signal Sd1 based on an output signal from the first adder 21, and outputs the second constant envelope signal Sd2 based on an output signal from the second adder 22. The constant envelope signal generation circuit 20 illustrated in FIG. 2 outputs the output signal from the first adder 21 as the first constant envelope signal Sd1, and outputs the output signal from the second adder 22 as the second constant envelope signal Sd2.

Here, a basic principle of generating the first constant envelope signal Sd1 and the second constant envelope signal Sd2 from the input signal Si having envelope variation in the constant envelope signal generation circuit 20 of the power amplifier circuit of this example is described with reference to FIGS. 3 and 4. FIGS. 3 and 4 illustrate vector displays of relationships among the input signal Si with envelope variation, the first fundamental signal Sa1, the second fundamental signal Sa2, the first converted signal Sc1, the second converted signal Sc2, the first constant envelope signal Sd1, and the second constant envelope signal Sd2. Here, for simple description, it is supposed that the amplitude of the first fundamental signal Sa1 and the second fundamental signal Sa2 is half an amplitude of the input signal Si with envelope variation, and the phase of the first fundamental signal Sa1 and the second fundamental signal Sa2 is set to be the same as the phase of the input signal Si with envelope variation.

As illustrated in FIG. 3, the constant envelope signal generation circuit 20 in the power amplifier circuit of this example distributes the input signal Si having envelope variation into the first distributed signal and the second distributed signal having the same amplitude and the same phase. The first distributed signal and the second distributed signal have the same phase as the input signal Si, which are used as the first fundamental signal Sa1 and the second fundamental signal Sa2, respectively. Then, the first constant envelope signal Sd1 is generated by vector addition of the first fundamental signal Sa1 and the first converted signal Sc1 advanced in phase with respect to the first fundamental signal Sa1 by $\pi/2$. In addition, the second constant envelope signal Sd2 is generated by vector addition of the second fundamental signal Sa2 and the second converted signal Sc2 delayed in phase with respect to the second fundamental signal Sa2 by $\pi/2$. Here, in a case where X denotes the amplitude of the first fundamental signal Sa1 and the second fundamental signal Sa2, Y denotes the amplitude of the first converted signal Sc1 and the second converted signal Sc2, and B denotes the amplitude of the first constant envelope signal Sd1 and the second constant envelope signal Sd2, the relationship of $X^2+Y^2=B^2$ holds thereamong.

Therefore, in order that the relationship of $X^2+Y^2=A^2$ (A denotes any constant amplitude larger than X) always hold, when the amplitude X of the first fundamental signal Sa1 and the second fundamental signal Sa2 varies due to variation of the amplitude of the input signal Si having envelope variation, the amplitude Y of the first converted signal Sc1 and the second converted signal Sc2 is changed so that $Y^2=A^2-X^2$ is satisfied. Thus, the amplitude B of the first constant envelope signal Sd1 and the second constant envelope signal Sd2 may be the constant amplitude A. Thus, the first constant envelope signal Sd1 and the second constant envelope signal Sd2 may be literally constant envelope signals having the constant amplitude.

For instance, as illustrated in FIG. 4, if the amplitude X of the first fundamental signal Sa1 and the second fundamental signal Sa2 is decreased along with a decrease of the amplitude of the input signal Si having envelope variation, the amplitude Y of the first converted signal Sc1 and the second converted signal Sc2 increases so as to satisfy $Y^2=A^2-X^2$. Thus, the amplitude B of the first constant envelope signal Sd1 and the second constant envelope signal Sd2 may be maintained to be constant without any change.

In this way, the constant envelope signal generation circuit 20 in the power amplifier circuit according to this embodiment is capable of converting the input signal Si having envelope variation into the two constant envelope signals including the first constant envelope signal Sd1 and the second constant envelope signal Sd2. Note that it is apparent from FIGS. 3 and 4 that if the vector addition of the first constant envelope signal Sd1 and the second constant envelope signal Sd2 generated as described above is performed, the original input signal Si with envelope variation is generated. It is understood that the input signal Si with envelope variation is precisely decomposed into the two constant envelope signals including the first constant envelope signal Sd1 and the second constant envelope signal Sd2. Actually, the fundamental signal for conversion Sb is also derived from the input signal Si with envelope variation. Therefore, the amplitude X of the first fundamental signal Sa1 and the second fundamental signal Sa2 becomes smaller than a half of the amplitude of the input signal Si with envelope variation. As a result, the amplitude of the signal obtained by vector addition of the first constant envelope signal Sd1 and the second constant envelope signal Sd2 becomes smaller than the amplitude of the input signal Si with envelope variation. However, each of the first constant envelope signal Sd1 and the second constant envelope signal Sd2 is a signal to be amplified, and hence there arises no problem.

Further, as illustrated in FIG. 2, the converted signal generation circuit 30 in the power amplifier circuit of this example includes a phase shifting circuit 60 and a conversion fundamental signal amplifier circuit 40. The phase shifting circuit 60 changes the phase of the fundamental signal for conversion Sb so as to generate the first converted signal Sc1 advanced in phase with respect to the first fundamental signal Sa1 by $\pi/2$, and the second converted signal Sc2 delayed in phase with respect to the second fundamental signal Sa2 by $\pi/2$. The conversion fundamental signal amplifier circuit 40 amplifies the fundamental signal for conversion Sb in accordance with the amplitude X of the first fundamental signal Sa1 and the second fundamental signal Sa2 so that the amplitude Y of the first converted signal Sc1 and the second converted signal Sc2 satisfies $Y^2=A^2-X^2$.

Still further, as illustrated in FIG. 2, the conversion fundamental signal amplifier circuit 40 in the power amplifier circuit of this example includes an amplitude detection signal generation circuit 50, a subtractor 41, and a variable gain amplifier 42. The amplitude detection signal generation circuit 50 generates an amplitude detection signal Se having a DC voltage α corresponding to the amplitude of the signal Sd1 output from the first adder 21 and the signal Sd2 output from the second adder 22. The DC voltage α increases in accordance with an increase of the amplitude of the signals Sd1 and Sd2, and decreases in accordance with a decrease of the amplitude of the signals Sd1 and Sd2. For instance, the DC voltage α is proportional to the amplitude of the signal Sd1 and the signal Sd2. A reference signal Sf having any DC voltage β larger than the DC voltage α and the amplitude detection signal Se are supplied to the subtractor 41, the subtractor 41 outputs a signal having a DC voltage γ satisfying γ=β−α. A gain control signal Sg is generated based on the signal output from the subtractor 41 and is supplied to the variable gain amplifier 42. The variable gain amplifier 42 amplifies the fundamental signal for conversion Sb based on the gain control signal Sg so that the amplitude Y of the first converted signal Sc1 and the second converted signal Sc2 satisfies $Y^2=A^2-X^2$.

Here, the amplitude of the first constant envelope signal Sd1 and the second constant envelope signal Sd2 may be controlled based on a value of the DC voltage β of the reference signal Sf. For instance, if the DC voltage β is set to a large value, the gain control signal Sg to be supplied to the variable gain amplifier 42 increases. As a result, a gain of amplifying the fundamental signal for conversion Sb increases. Therefore, the amplitude of the first converted signal Sc1 and the second converted signal Sc2 increases. As described above, the amplitude (X) of the first fundamental signal Sa1 and the second fundamental signal Sa2, the amplitude (Y) of the first converted signal Sc1 and the second converted signal Sc2, and the amplitude (B) of the first constant envelope signal Sd1 and the second constant envelope signal Sd2 have the relationship of $X^2+Y^2=B^2$. Therefore, if the amplitude of the first converted signal Sc1 and the second converted signal Sc2 is increased, the amplitude of the first constant envelope signal Sd1 and the second constant envelope signal Sd2 is also increased. Therefore, if the DC voltage β is set to a large value, the amplitude of the first constant envelope signal Sd1 and the second constant envelope signal Sd2 may be increased. Similarly, if the DC voltage β is set to a small value, the amplitude of the first constant envelope signal Sd1 and the second constant envelope signal Sd2 may be decreased.

In addition, as illustrated in FIG. 2, the amplitude detection signal generation circuit 50 of the power amplifier circuit of this example supplies a mixer 51 with two in-phase signals having an amplitude which is proportional to the amplitude of the signal Sd1 output from the first adder 21 or the signal Sd2 output from the second adder 22. The mixer 51 outputs a signal containing a DC voltage component corresponding to the amplitude of the signal Sd1 output from the first adder 21 or the signal Sd2 output from the second adder 22. In other words, the DC voltage component of the output signal from the mixer 51 increases in accordance with an increase of the amplitude of the signal Sd1 or the signal Sd2, and decreases in accordance with a decrease of the amplitude of the signal Sd1 or the signal Sd2. For instance, the DC voltage component of the output signal from the mixer 51 is proportional to the amplitude of the signal Sd1 or the signal Sd2. This signal is used for generating the amplitude detection signal Se.

In the power amplifier circuit of this example, the input signal Si with envelope variation is distributed by the power distributor 23 into the first distributed signal and the second distributed signal having the same amplitude and the same phase, and the distributed signal for conversion, which are used as the first fundamental signal Sa1, the second fundamental signal Sa2, and the fundamental signal for conversion Sb, respectively. Note that the phases of the first fundamental signal Sa1, the second fundamental signal Sa2, and the fundamental signal for conversion Sb are all set to the same as the phase of the input signal Si with envelope variation. Then, the first fundamental signal Sa1 and the second fundamental signal Sa2 are supplied to the first adder 21 and the second adder 22, respectively. The phase of the fundamental signal for conversion Sb is advanced by π/2 by a phase shifter 61 constituting a part of the phase shifting circuit 60, and then the signal is amplified by the variable gain amplifier 42. After that, the fundamental signal for conversion Sb is divided into two. One thereof is supplied as the first converted signal Sc1 to the first adder 21, and the other is advanced in phase by n by a phase shifter 62 constituting a part of the phase shifting circuit 60, and then is supplied as the second converted signal Sc2 to the second adder 22.

The first adder 21 performs vector addition of the first fundamental signal Sa1 and the first converted signal Sc1 so as to output the first constant envelope signal Sd1. The second adder 22 performs vector addition of the second fundamental signal Sa2 and the second converted signal Sc2 so as to output the second constant envelope signal Sd2. The first constant envelope signal Sd1 output from the first adder 21 is supplied to the first amplifier 11, but before that, a part thereof is branched and is further divided into two to be supplied to the mixer 51. A signal containing a DC voltage component corresponding to the amplitude of the first constant envelope signal Sd1 is output from the mixer 51, and is supplied to an amplitude detection signal generation adder 52 of the amplitude detection signal generation circuit 50. Similarly, the second constant envelope signal Sd2 output from the second adder 22 is supplied to the second amplifier 12, but before that, a part thereof is branched and is further divided into two to be supplied to the mixer 51. A signal containing a DC voltage component corresponding to the amplitude of the second constant envelope signal Sd2 is output from the mixer 51, and is supplied to the amplitude detection signal generation adder 52 of the amplitude detection signal generation circuit 50.

The amplitude detection signal generation adder 52 adds the input signal containing a DC voltage component corresponding to the amplitude of the first constant envelope signal Sd1 and the input signal containing a DC voltage component corresponding to the amplitude of the second constant envelope signal Sd2 so as to output the amplitude detection signal Se to the subtractor 41. The subtractor 41 outputs a signal obtained by subtracting the amplitude detection signal Se from the reference signal Sf that is separately supplied, as an output signal to a low-pass filter 43. The low-pass filter 43 attenuates high frequency components including a frequency twice the frequency of the first constant envelope signal Sd1 and the second constant envelope signal Sd2, with the result that an output signal containing mostly a DC voltage component is supplied to a buffer amplifier 44. The buffer amplifier 44 amplifies the input signal and then outputs the signal as the gain control signal Sg to the variable gain amplifier 42.

Thus, the DC voltage component of the gain control signal Sg which increases or decreases inversely to an increase or a decrease of the amplitude of the first constant envelope signal Sd1 and the second constant envelope signal Sd2 is applied as a bias voltage to the variable gain amplifier 42. Therefore, an amplified quantity of the variable gain amplifier 42 increases or decreases inversely to an increase or a decrease of the amplitude of the first constant envelope signal Sd1 and the second constant envelope signal Sd2. As a result, the amplitude of the first converted signal Sc1 and the second converted signal Sc2 obtained by amplifying the fundamental signal for conversion Sb in the variable gain amplifier 42 also increases or decreases inversely to an increase or a decrease of the amplitude of the first constant envelope signal Sd1 and the second constant envelope signal Sd2. Such a feedback circuit is formed, and hence the amplitude of the first constant envelope signal Sd1 and the second constant envelope signal Sd2 is maintained to be constant so that each of the signals becomes literally a constant envelope signal.

In addition, the first amplifier 11 amplifies the input first constant envelope signal Sd1 and outputs the signal as the first amplified signal Sh1 to the output adder 13, and the second amplifier 12 amplifies the input second constant envelope signal Sd2 and outputs the signal as the second amplified signal Sh2 to the output adder 13. The output adder 13 performs vector addition of the input first amplified signal Sh1 and the input second amplified signal Sh2 so as to output the output signal So having envelope variation.

In this way, the power amplifier circuit of this example converts the input signal Si with envelope variation into the first constant envelope signal Sd1 and the second constant envelope signal Sd2. The first constant envelope signal Sd1 and the second constant envelope signal Sd2 are amplified by the first amplifier 11 and the second amplifier 12, respectively, with high power added efficiency, and then are combined by the output adder 13. As a result, the amplified output signal So with envelope variation is output. According to the power amplifier circuit of this example having the above-mentioned structure, the first amplifier 11 and the second amplifier 12 amplify the constant envelope signal. Therefore, a nonlinear amplifier with high power added efficiency may be used as the first amplifier 11 and the second amplifier 12. Therefore, the signal having envelope variation may be amplified with high power added efficiency.

In addition, according to the power amplifier circuit of this example, the first constant envelope signal Sd1 and the second constant envelope signal Sd2 may be generated simply by vector addition of the first fundamental signal Sa1 and the first converted signal Sc1 and by vector addition of the second fundamental signal Sa2 and the second converted signal Sc2, without a complicated calculation. Therefore, the constant envelope signal generation circuit 20 may be formed of a simple analog circuit with low power consumption. Thus, power consumption of the entire power amplifier circuit may be reduced so that power added efficiency of the entire power amplifier circuit may be improved.

Further, in the power amplifier circuit of this example, the DC voltage γ of the gain control signal Sg increases or decreases inversely to an increase or a decrease of the DC voltage α, in accordance with the DC voltage α that increases or decreases in proportion to the amplitude of the first constant envelope signal Sd1 and the second constant envelope signal Sd2. In addition, the amplified quantity of the fundamental signal for conversion Sb by the variable gain amplifier 42 in accordance with an increase or a decrease of the DC voltage γ of the gain control signal Sg. As a result, the amplitude Y of the first converted signal Sc1 and the second converted signal Sc2 increases or decreases. In this way, the amplitude Y of the first converted signal Sc1 and the second converted signal Sc2 increases or decreases inversely to an increase or a decrease of the amplitude of the first constant envelope signal Sd1 and the second constant envelope signal Sd2, in accordance with an increase or a decrease of the amplitude of the first constant envelope signal Sd1 and the second constant envelope signal Sd2. Thus, the feedback circuit is formed to increase or decrease the amplitude of the first constant envelope signal Sd1 and the second constant envelope signal Sd2 inversely than before. It is possible to suppress a change in amplitude of the first constant envelope signal Sd1 and the second constant envelope signal Sd2 so as to realize a literally constant envelope signal by setting a response speed of the feedback circuit faster than a speed of change in the amplitude X of the first fundamental signal Sa1 and the second fundamental signal Sa2 which causes increase or decrease of the amplitude of the first constant envelope signal Sd1 and the second constant envelope signal Sd2. In this way, it is possible to generate the first converted signal Sc1 and the second converted signal Sc2 by a simple analog circuit so that the amplitude X of the first fundamental signal Sa1 and the second fundamental signal Sa2, and the amplitude Y of the first converted signal Sc1 and the second converted signal Sc2 always have the relationship of $Y^2+X^2=A^2$ (constant).

In the power amplifier circuit of this example, for example, an image suppression type double balance mixer or the like may be used as the adders including the output adder 13, the first adder 21, and the second adder 22. In addition, for example, an operational amplifier or the like may be used as the subtractor 41.

Note that the first fundamental signal Sa1 and the second fundamental signal Sa2 are signals having the same phase as the input signal Si in the above description, but it is sufficient that the first fundamental signal Sa1 and the second fundamental signal Sa2 be signals having predetermined phase relationships with the input signal Si. For instance, the first fundamental signal Sa1 may be a signal having the same phase as the input signal Si while the second fundamental signal Sa2 may be a signal advanced in phase with respect to the input signal Si by π. In other words, the first fundamental signal Sa1 may be the first distributed signal distributed from the input signal Si while the second fundamental signal Sa2 may be the signal obtained by advancing the phase of the second distributed signal distributed from the input signal Si by π. In this case, the power distributor 23 and the phase shifter for advancing the phase of the second distributed signal by π correspond to the "fundamental signal generation circuit". In addition, in this case, the phase shifter 62 may be eliminated. Further, in this case, it is possible to advance the phase of the output signal from the second adder 22 by π (i.e., to change the phase of the output signal from the second adder 22 based on a phase relationship between the second fundamental signal Sa2 and the input signal Si) and then to output the signal as the second constant envelope signal Sd2. Alternatively, it is possible to output the signal output from the second adder 22 with the original phase as the second constant envelope signal Sd2, and to advance the phase of the signal after being amplified by the second amplifier 12 by π (i.e., to change the phase of the signal after being amplified by the second amplifier 12 based on a phase relationship between the second fundamental signal Sa2 and the input signal Si). Alternatively, it is possible to output the output signal from the second adder 22 with the original phase as the second constant envelope signal Sd2, to supply the signal after being amplified by the second amplifier 12 with the original phase to the output adder 13, to delay the phase of the output signal from the output adder 13 by π/2 (i.e., to change the phase of the output signal from the output adder 13 based on a phase relationship between the second fundamental signal Sa2 and the input signal Si), and then to output the signal as the output signal So. Also by those methods, it is possible to obtain the amplified output signal So with envelope variation.

Note that if the first fundamental signal Sa1 and the second fundamental signal Sa2 have the same phase as the input signal Si as in this embodiment, it is not necessary to change the phase of the output signal from the first adder 21 or the second adder 22, the signal after being amplified by the first amplifier 11 or the second amplifier 12, or the output signal from the output adder 13, which is preferable.

[Example 2 of Embodiment]

Figure 5:
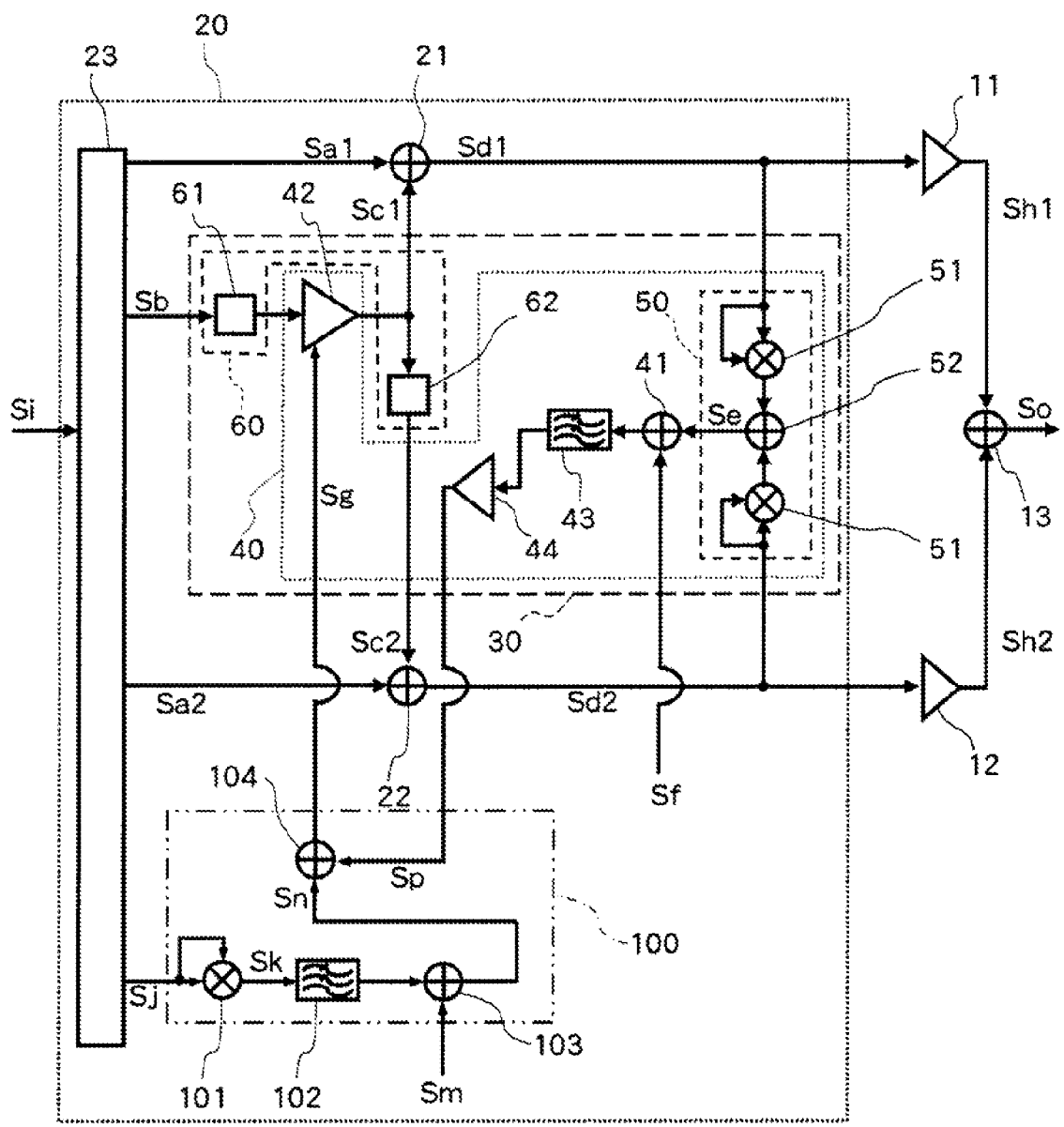
FIG. 5 is a circuit diagram illustrating schematically another example of the power amplifier circuit according to the embodiment of the present invention.

FIG. 5 is a circuit diagram illustrating schematically another example of the power amplifier circuit according to the embodiment of the present invention. Note that a structural element similar to that of Example 1 is denoted by the same reference symbol, and description thereof is omitted.

Figure 6:
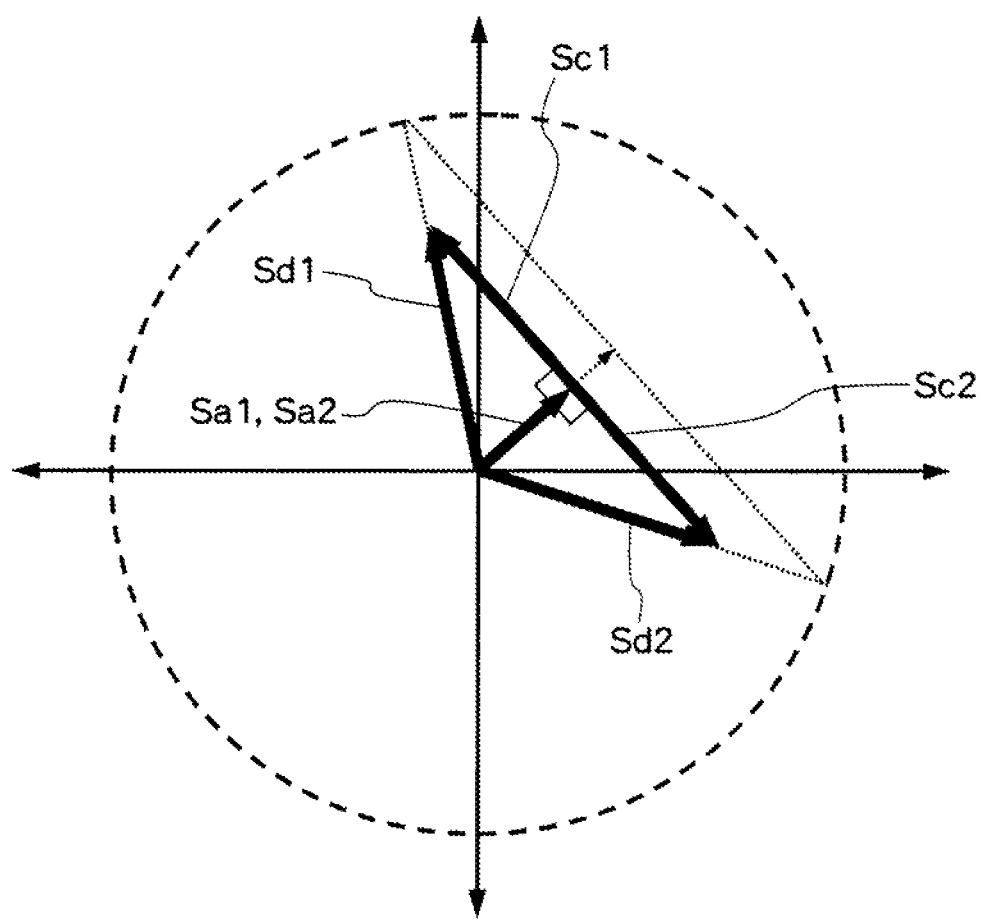
FIG. 6 is a diagram for describing a problem which is solved by the power amplifier circuit according to the embodiment of the present invention.
Figure 7:
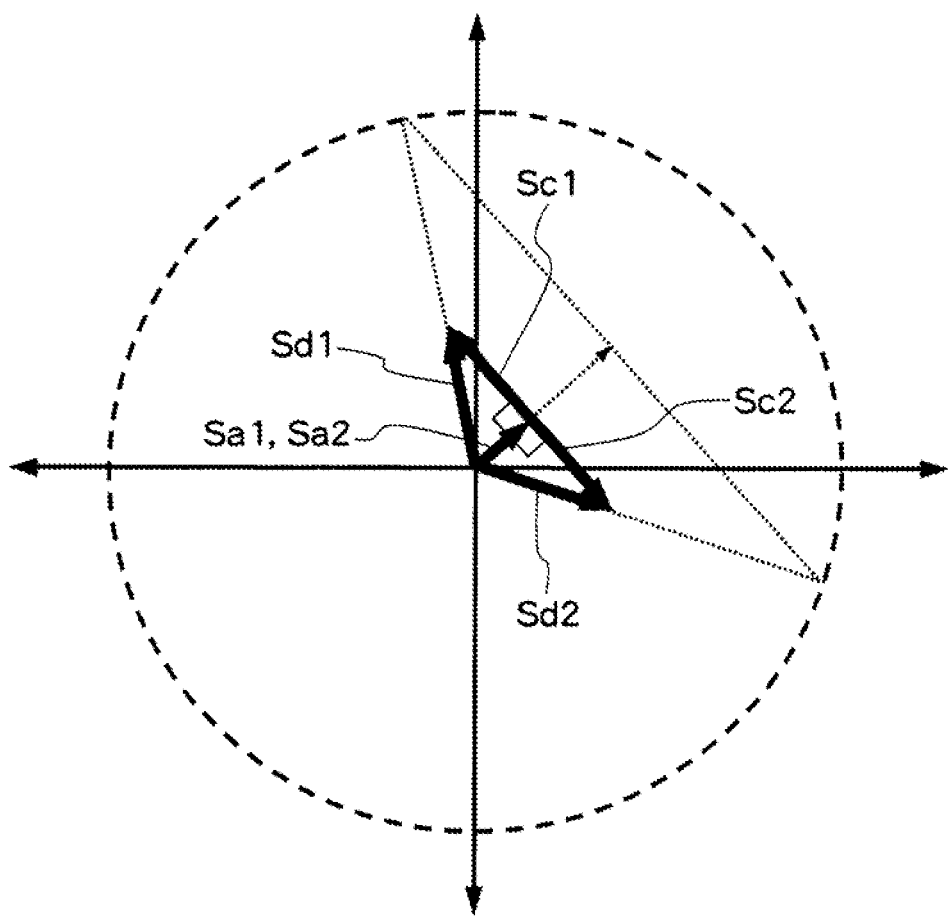
FIG. 7 is a diagram for describing the problem which is solved by the power amplifier circuit according to the embodiment of the present invention.

First, the problem to be solved by the power amplifier circuit according to this embodiment is described. If the amplitude of the input signal Si is relatively small, the amplitude (Y) of the first converted signal Sc1 and the second converted signal Sc2 satisfying $Y^2=A^2-X^2$ is larger than that in the case where the amplitude is relatively large. Therefore, the fundamental signal for conversion Sb has to be amplified more. Therefore, if the amplitude of the input signal Si is small, the gain of amplifying the fundamental signal for conversion Sb becomes insufficient. As a result, the first converted signal Sc1 and the second converted signal Sc2 satisfying $Y^2=A^2-X^2$ may not be generated. FIGS. 6 and 7 are diagrams for describing this state. As illustrated in FIGS. 6 and 7, if the above-mentioned state is caused, there occurs a phenomenon that the amplitude of the signals Sd1 and Sd2 is decreased while a phase difference between the signals Sd1 and Sd2 is maintained to be a constant angle along with a decrease of the amplitude of the input signal Si. In other words, the signals Sd1 and Sd2 do not become constant envelope signals.

As illustrated in FIG. 5, the power amplifier circuit according to this embodiment is different from Example 1 in that a loop gain control circuit 100 is included. The loop gain control circuit 100 includes a mixer 101, a low-pass filter 102, a subtractor 103, and an adder 104. In the power amplifier circuit of this example, a signal Sj is also distributed from the input signal Si. The signal Sj is divided into two to be supplied to the mixer 101. The mixer 101 outputs a signal Sk containing a DC voltage Va corresponding to the amplitude of the signal Sj. The DC voltage Va increases in accordance with an increase of the amplitude of the signal Sj and decreases in accordance with a decrease of the amplitude of the signal Sj. The DC voltage Va is proportional to the amplitude of the signal Sj. The low-pass filter 102 attenuates high frequency components so that a signal containing mostly a DC voltage component is supplied to the subtractor 103. The signal Sk in which high frequency components are attenuated by the low-pass filter 102, and a reference signal Sm having a predetermined DC voltage Vb are supplied to the subtractor 103. The subtractor 103 outputs a signal Sn having a DC voltage Vc satisfying Vc=Vb−Va. If Va is smaller than Vb (i.e., if the amplitude of the input signal Si is smaller than a predetermined amplitude), the DC voltage Vc of the signal Sn increases along with a decrease of the amplitude of the input signal Si. Note that if Va is larger than or equal to Vb (i.e., if the amplitude of the input signal Si is larger than or equal to a predetermined amplitude), the DC voltage Vc of the signal Sn becomes zero. A signal Sp obtained by amplifying the signal having the DC voltage γ by the buffer amplifier 44, and the signal Sn having the DC voltage Vc are supplied to the adder 104. The adder 104 supplies the signal obtained by adding the signals Sp and Sn as the gain control signal Sg to the variable gain amplifier 41.

In the power amplifier circuit according to this embodiment, if the amplitude of the input signal Si is smaller than a predetermined amplitude (i.e., if Va<Vb is satisfied), the gain control voltage that is supplied to the variable gain amplifier 41 is increased by Vc (Vc=Vb−Va) to be raised. As a result, the gain of amplifying the fundamental signal for conversion Sb increases. According to the power amplifier circuit according to this embodiment, it is possible to maintain the gain of amplifying the fundamental signal for conversion Sb not to be insufficient even if the amplitude of the input signal Si becomes relatively small. As a result, the phenomenon described above hardly occurs, and it is possible to secure that the signals Sd1 and Sd2 are constant envelope signals even if the amplitude of the input signal Si becomes relatively small. For instance, it is supposed that the above-mentioned phenomenon occurs in a case where the amplitude of the input signal Si becomes smaller than or equal to a certain amplitude Xa in the state where the loop gain control circuit 100 is not provided. In this case, if the loop gain control circuit 100 is provided, the above-mentioned phenomenon occurs in a case where the amplitude of the input signal Si becomes an amplitude Xb that is smaller than the amplitude Xa, and the above-mentioned phenomenon does not occur until the amplitude of the input signal Si becomes Xb. Note that the amplitude of the input signal Si at which the above-mentioned phenomenon occurs may be controlled by adjusting a value of the DC voltage Vb of the reference signal Sm in the power amplifier circuit according to this embodiment. For instance, it is possible to make settings so that the above-mentioned phenomenon occurs in a case where the amplitude of the input signal Si becomes a desired amplitude. In addition, it is also possible to make settings so that the above-mentioned phenomenon does not occur even if the amplitude of the input signal Si is small by setting the value of the DC voltage Vb of the reference signal Sm to a large value.

[Example 3 of Embodiment]

Figure 8:
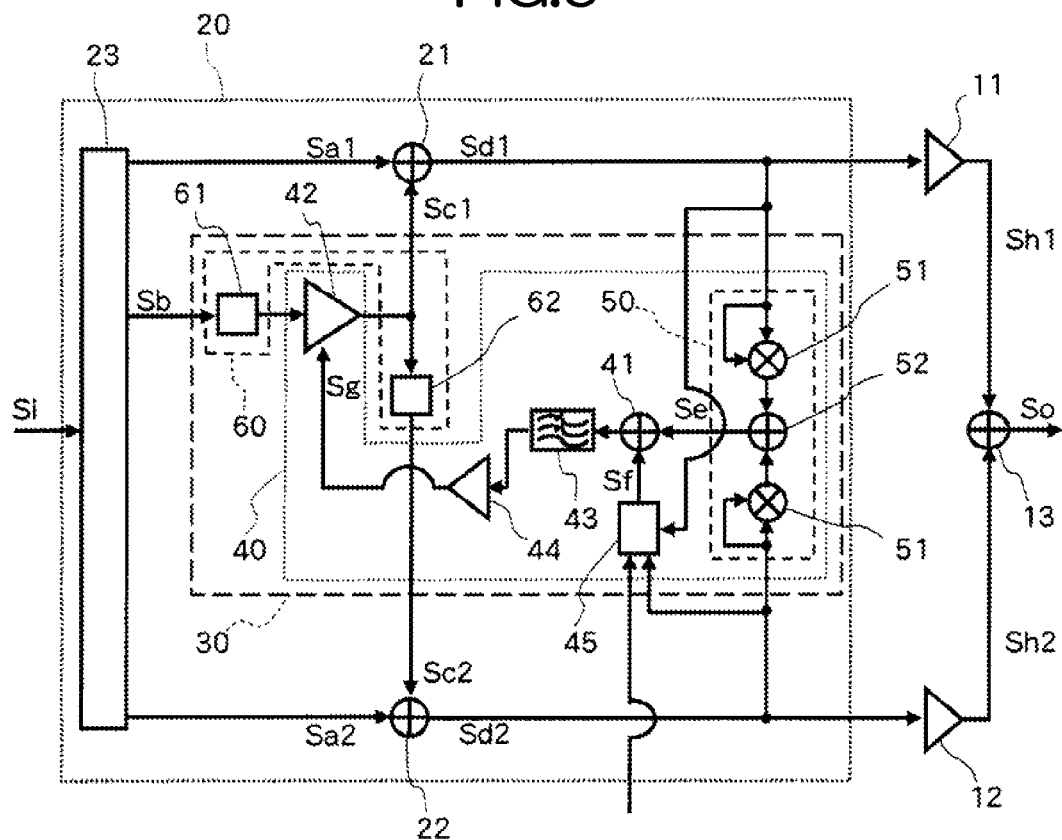
FIG. 8 is a circuit diagram illustrating schematically still another example of the power amplifier circuit according to the embodiment of the present invention.

FIG. 8 is a circuit diagram illustrating schematically another example of the power amplifier circuit according to the embodiment of the present invention. Note that only points different from Example 1 described above are described in this example, and similar structural elements are denoted by the same reference symbols so that overlapping descriptions are omitted.

The power amplifier circuit of this example includes a reference potential control circuit 45 which is supplied with parts of the first constant envelope signal Sd1 and the second constant envelope signal Sd2 and outputs the reference signal Sf.

According to the power amplifier circuit of this example, parts of the first constant envelope signal Sd1 and the second constant envelope signal Sd2 are each branched to the reference potential control circuit 45 so that the DC voltage β of the reference signal Sf may be determined after confirming a variation width of the amplitude of the first constant envelope signal Sd1 and the second constant envelope signal Sd2. As described above, the amplitude of the first constant envelope signal Sd1 and the second constant envelope signal Sd2 varies in accordance with a variation of the amplitude of the input signal Si. In addition, the amplitude of the first constant envelope signal Sd1 and the second constant envelope signal Sd2 is controlled based on a value of the DC voltage β. Therefore, it may be said that the reference potential control circuit 45 (amplitude control circuit) is a circuit for controlling the amplitude of the first constant envelope signal Sd1 and the second constant envelope signal Sd2 based on the amplitude of the input signal Si. Because the reference potential control circuit 45 is provided, the DC voltage β of the reference signal Sf may be optimized also in a plurality of systems having largely different power supply voltages or amplitudes of the input signals Si having envelope variation, and a power amplifier circuit with higher versatility may be realized.

[Example 3-1 of Embodiment]

The problem that is solved by Example 2 may also be solved by the power amplifier circuit (reference potential control circuit 45) illustrated in FIG. 8. The reference potential control circuit 45 in this case increases the DC voltage 13 of the reference signal Sf in the case where the amplitude of the input signal Si is smaller than a predetermined amplitude. For instance, if the amplitude of the input signal Si is smaller than a predetermined amplitude, the reference potential control circuit 45 increases the DC voltage β of the reference signal Sf gradually as the amplitude of the input signal Si is decreased. As described above, the gain control signal Sg corresponding to the signal having the DC voltage γ satisfying γ=β−α is supplied to the variable gain amplifier 42. Therefore, if the DC voltage β of the reference signal Sf increases, the gain of amplifying the fundamental signal for conversion Sb is increased.

According to the reference potential control circuit 45 in this case, if the amplitude of the input signal Si is smaller than a predetermined amplitude, the gain of amplifying the fundamental signal for conversion Sb is controlled so as to be further increased. Therefore, it is possible to control so that the gain of amplifying the fundamental signal for conversion Sb does not become insufficient even if the amplitude of the input signal Si becomes relatively small. As a result, it is possible to secure that the signals Sd1 and Sd2 become constant envelope signals even if the amplitude of the input signal Si becomes relatively small.

[Example 3-2 of Embodiment]

According to the power amplifier circuit (reference potential control circuit 45) illustrated in FIG. 8, it is possible to solve the problem described below as well. If an amplitude difference occurs between the first constant envelope signal Sd1 and the second constant envelope signal Sd2, a phase difference is generated between the input signal Si and the output signal So generated by vector addition of the first constant envelope signal Sd1 and the second constant envelope signal Sd2. This phase error increases along with an increase of a phase difference between the first constant envelope signal Sd1 and the second constant envelope signal Sd2. In other words, if the phase difference between the first constant envelope signal Sd1 and the second constant envelope signal Sd2 is relatively large, a phase error of the output signal So becomes relatively large even if the amplitude difference between the first constant envelope signal Sd1 and the second constant envelope signal Sd2 is relatively small. As described above, the phase difference between the first constant envelope signal Sd1 and the second constant envelope signal Sd2 increases so as to approach 180 degrees along with a decrease of the amplitude of the input signal Si. Therefore, if the amplitude of the input signal Si is relatively small, a phase error of the output signal So becomes relatively large. For instance, if a signal following a modulation method with large dynamic range is to be amplified, the above-mentioned problem needs to be solved.

Figure 9:
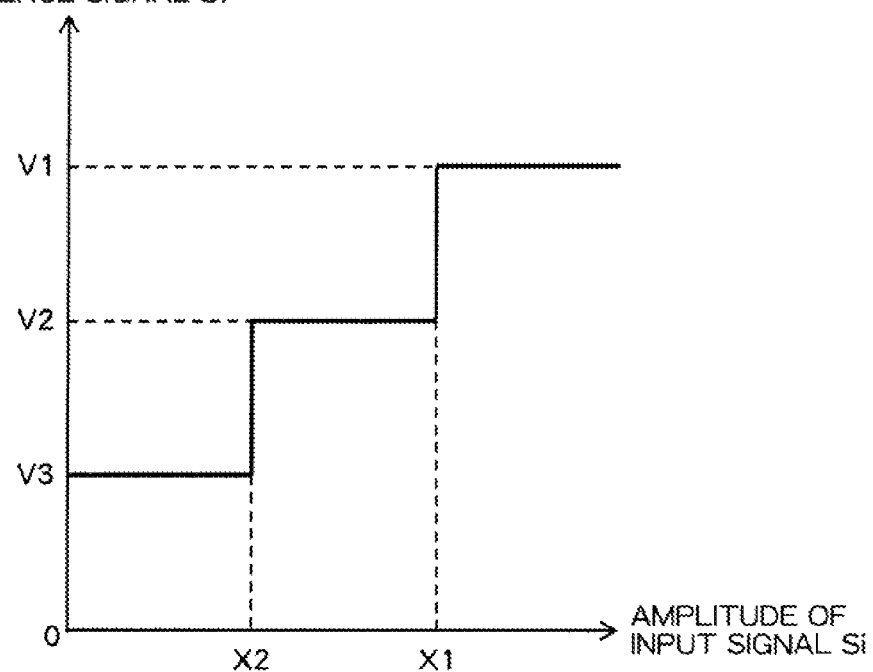
FIG. 9 is a diagram for describing an operation of a reference potential control circuit.
Figure 10:
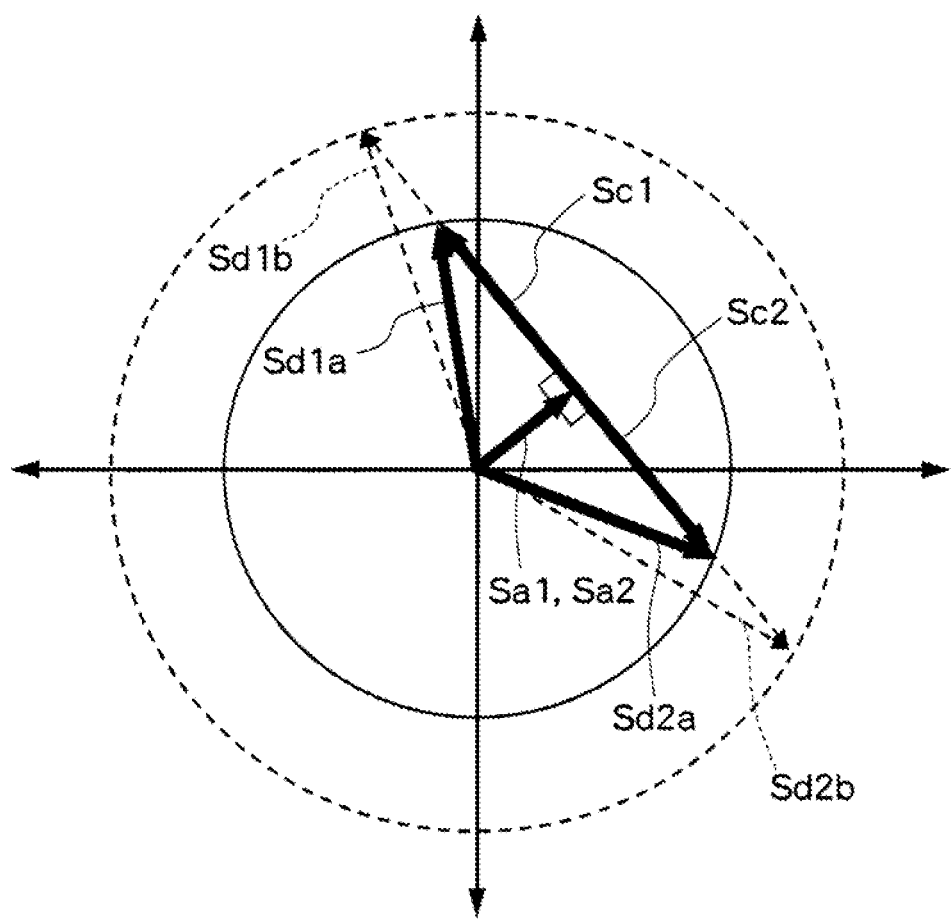
FIG. 10 is a diagram for describing the operation of the reference potential control circuit.

FIGS. 9 and 10 are diagrams for describing an operation of the reference potential control circuit 45 (amplitude control circuit) for solving the above-mentioned problem. As illustrated in FIG. 9, the reference potential control circuit 45 controls the DC voltage β of the reference signal Sf so that the DC voltage β of the reference signal Sf decreases step by step along with a decrease of the amplitude of the input signal Si. In the example illustrated in FIG. 9, if the amplitude of the input signal Si is larger than or equal to X1, the reference potential control circuit 45 sets the DC voltage β of the reference signal Sf to V1. In addition, if the amplitude of the input signal Si is larger than or equal to X2 and is smaller than X1, the reference potential control circuit 45 sets the DC voltage β of the reference signal Sf to V2 that is smaller than V1. The amplitude of the first constant envelope signal Sd1 and the second constant envelope signal Sd2 in this case becomes smaller than that in the case where the amplitude of the input signal Si is larger than or equal to X1. In addition, if the amplitude of the input signal Si is smaller than X2, the reference potential control circuit 45 sets the DC voltage β of the reference signal Sf to V3 that is smaller than V2. The amplitude of the first constant envelope signal Sd1 and the second constant envelope signal Sd2 in this case becomes smaller than that in the case where the amplitude of the input signal Si is larger than or equal to X2. In this way, according to the reference potential control circuit 45 in this case, the amplitude of the first constant envelope signal Sd1 and the second constant envelope signal Sd2 decreases step by step along with a decrease of the amplitude of the input signal Si.

As illustrated in FIG. 10, if the amplitude of the first constant envelope signal Sd1 and the second constant envelope signal Sd2 becomes small (like Sd1*a* and Sd2*a* of FIG. 10), the phase difference between the first constant envelope signal Sd1 and the second constant envelope signal Sd2 becomes small compared with the case where the amplitude of the first constant envelope signal Sd1 and the second constant envelope signal Sd2 is large (like Sd1*b* and Sd2*b* of FIG. 10). Therefore, according to the reference potential control circuit 45 in this case, it is possible to control so that the phase difference between the first constant envelope signal Sd1 and the second constant envelope signal Sd2 does not become large. Thus, a phase error of the output signal So may be reduced.

Note that the reference potential control circuit 45 in this case controls the first amplifier 11 and the second amplifier 12 so that an operating point of amplifying the first constant envelope signal Sd1 and the second constant envelope signal Sd2 is in a saturation region of the first amplifier 11 and the second amplifier 12. In other words, the reference potential control circuit 45 controls a gate voltage or/and a gate width of the first amplifier 11 and the second amplifier 12 in synchronization with a variation of the DC voltage β of the reference signal Sf (i.e., a variation of the amplitude of the first constant envelope signal Sd1 and the second constant envelope signal Sd2). In this case, for example, the first amplifier 11 is constituted by connecting a plurality of amplifiers having the same operating point in parallel. The second amplifier 12 is constituted in the same manner. Then, the reference potential control circuit 45 selectively turns on and off the plurality of amplifiers included in the first amplifier 11 in synchronization with a variation of the amplitude of the first constant envelope signal Sd1 and the second constant envelope signal Sd2, to thereby control the gate width of the first amplifier 11. Similarly, the reference potential control circuit 45 selectively turns on and off the plurality of amplifiers included in the second amplifier 12 to thereby control the gate width of the second amplifier 12. Thus, it is possible to secure amplification with high power added efficiency.

Here, the DC voltage β of the reference signal Sf is controlled based on the amplitude of the input signal Si so that the amplitude of the first constant envelope signal Sd1 and the second constant envelope signal Sd2 decreases step by step. However, it is possible to control a gain of a loop part of amplifying the fundamental signal for conversion Sb based on the amplitude of the input signal Si so that the amplitude of the first constant envelope signal Sd1 and the second constant envelope signal Sd2 decreases step by step. For instance, it is possible to control at least one gain of the first adder 21, the second adder 22, the subtractor 41, the variable gain amplifier 42, the buffer amplifier 44, and the mixer 51 based on the amplitude of the input signal Si so that the amplitude of the first constant envelope signal Sd1 and the second constant envelope signal Sd2 decreases step by step. Further, if the method of controlling the DC voltage β of the reference signal Sf is adopted as in this embodiment, it may be realized relatively easily and preferably that the amplitude of the first constant envelope signal Sd1 and the second constant envelope signal Sd2 decreases step by step along with a decrease of the amplitude of the input signal Si.

[Example 4 of Embodiment]

Figure 11:
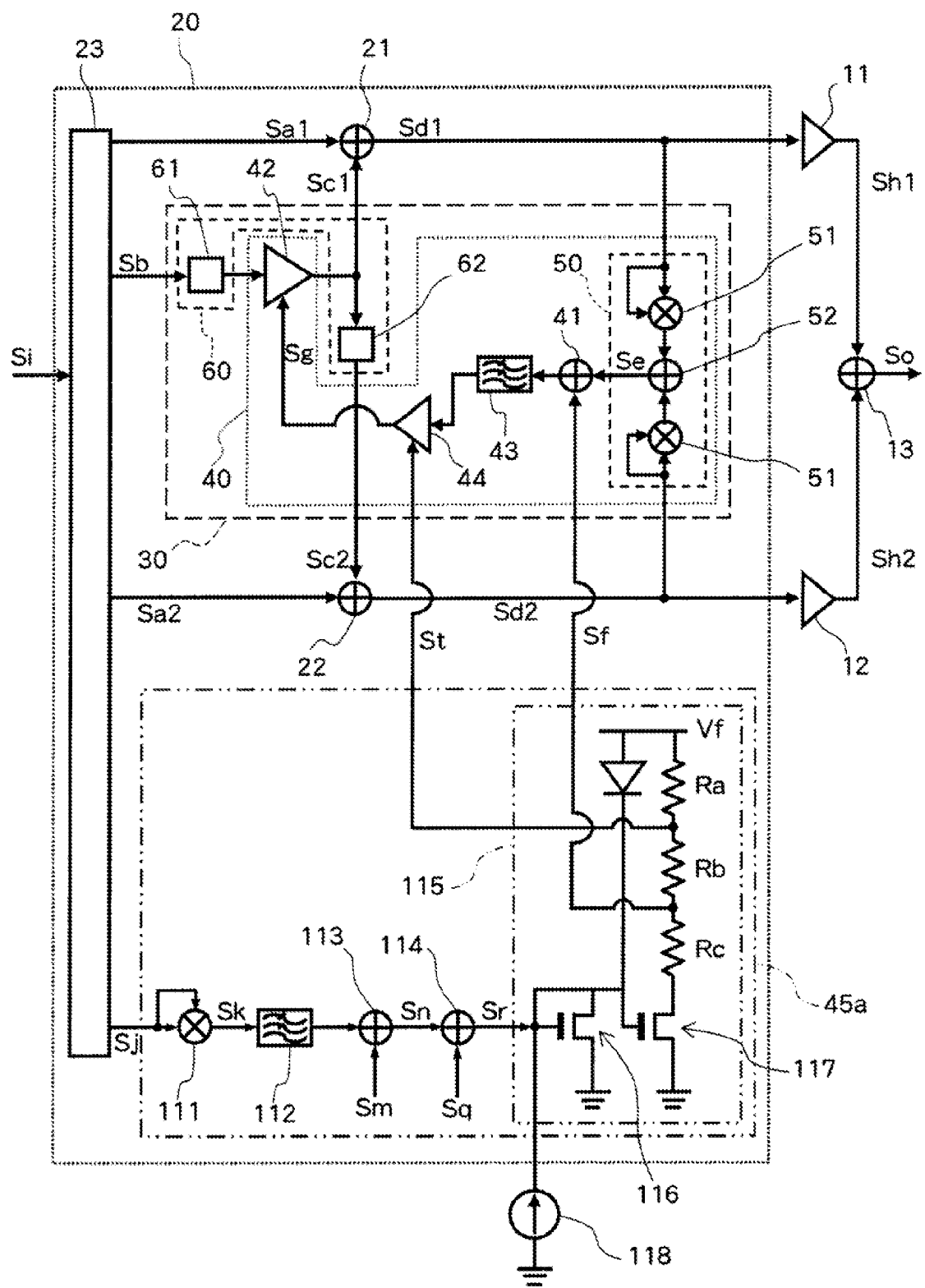
FIG. 11 is a circuit diagram illustrating schematically still another example of the power amplifier circuit according to the embodiment of the present invention.

In the reference potential control circuit 45 illustrated in FIG. 8, the magnitude of the amplitude of the input signal Si is detected based on the signals branched from the first constant envelope signal Sd1 and the second constant envelope signal Sd2. However, it is also possible to constitute so as to detect the magnitude of the amplitude of the input signal Si based on signals distributed from the input signal Si. FIG. 11 is a circuit diagram illustrating a power amplifier circuit in that case. Note that the power amplifier circuit (reference potential control circuit 45a) illustrated in FIG. 11 has a structure for solving the same problem as those solved by Example 2 and Example 3-1. Hereinafter, an operation of the reference potential control circuit 45a is described. Note that a structural element similar to that of Example 1 is denoted by the same reference symbol and description thereof is omitted.

As illustrated in FIG. 11, the reference potential control circuit 45a in this case includes a mixer 111, a low-pass filter 112, a subtractor 113, a subtractor 114, and a current mirror circuit 115. In the power amplifier circuit in this case, the signal Sj is also distributed from the input signal Si. The signal Sj is divided into two to be supplied to the mixer 111. The mixer 111 outputs the signal Sk having the DC voltage Va corresponding to the amplitude of the signal Sj. In other words, the DC voltage Va increases along with an increase of the amplitude of the signal Sj and decreases along with a decrease of the amplitude of the signal Sj. For instance, the DC voltage Va is proportional to the amplitude of the signal Sj. The low-pass filter 112 attenuates high frequency components and outputs a signal containing mostly a DC voltage component. The signal Sk whose high frequency components are attenuated by the low-pass filter 112, and the reference signal Sm having a predetermined DC voltage Vb are supplied to the subtractor 113. The subtractor 113 outputs the signal Sn having the DC voltage Vc satisfying Vc=Vb−Va. If Va<Vb is satisfied (i.e., if the amplitude of the input signal Si is smaller than a predetermined amplitude), the DC voltage Vc of the signal Sn increases along with a decrease of the amplitude of the input signal Si. Note that if Va≧Vb is satisfied (i.e., if the amplitude of the input signal Si is larger than or equal to a predetermined amplitude), the DC voltage Vc of the signal Sn becomes zero.

The signal Sn having the DC voltage Vc is supplied to the subtractor 114 from the subtractor 113, and a reference signal Sq having a DC voltage Vd is supplied to the subtractor 114 from, for example, a sample and hold circuit (not shown). The subtractor 114 supplies a signal Sr having a DC voltage Ve satisfying Ve=Vd−Vc to the current mirror circuit 115. Sum current (i+Δi) of current i due to a constant current source 118 and current Δi due to the applied DC voltage Ve flows in an FET 116 of the current mirror circuit 115. Further, the current i+Δi also flows in another FET 117. Then, a signal St having a DC voltage Vg satisfying Vg=Vf−(i+Δi)*Ra is supplied as the gain control signal to the buffer amplifier 44. Note that the buffer amplifier 44 is constituted so as to have a variable gain. In addition, a reference signal Sf having a DC voltage β satisfying β=Vf−(i+Δi)*(Ra+Rb) is supplied to the subtractor 41.

In the reference potential control circuit 45a, if the amplitude of the input signal Si is smaller than a predetermined amplitude (i.e., if Va<Vb), the DC voltage Ve of the signal Sr supplied to the current mirror circuit 115 decreases so that the current flowing in the current mirror circuit 115 also decreases. As a result, if the amplitude of the input signal Si is smaller than a predetermined amplitude (i.e., if Va<Vb), the DC voltage Vg of the signal St supplied as the gain control signal to the buffer amplifier 44 and the DC voltage β of the reference signal Sf supplied to the subtractor 41 increase. Therefore, the gain control signal Sg supplied to the variable gain amplifier 42 increases, and the gain of amplifying the fundamental signal for conversion Sb increases. Therefore, it is possible to control so that the gain of amplifying the fundamental signal for conversion Sb does not become insufficient even if the amplitude of the input signal Si becomes relatively small. As a result, it is possible to secure that the signals Sd1 and Sd2 become constant envelope signals even if the amplitude of the input signal Si becomes relatively small. Note that it is possible to adjust the timing to start raising the bottom of the gain of amplifying the fundamental signal for conversion Sb and the increased amount of the gain of amplifying the fundamental signal for conversion Sb, by adjusting the DC voltage Vb of the reference signal Sm and the DC voltage Vd of the reference signal Sq.

[Example 5 of Embodiment]

Figure 12:
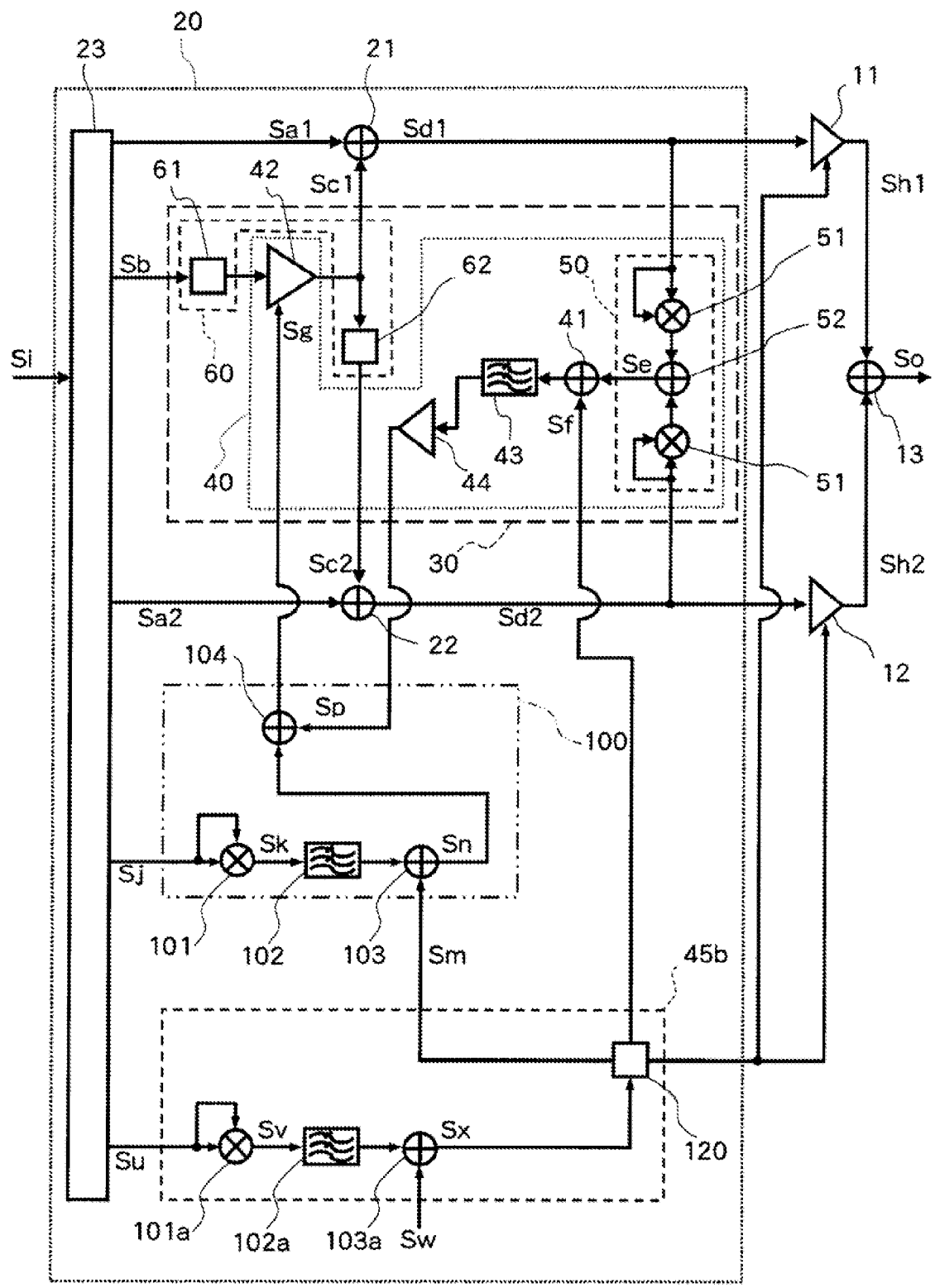
FIG. 12 is a circuit diagram illustrating schematically still another example of the power amplifier circuit according to the embodiment of the present invention.

A power amplifier circuit illustrated in FIG. 12 is also an example in the case where the magnitude of the amplitude of the input signal Si is detected based on the signals distributed from the input signal Si. Note that the power amplifier circuit (reference potential control circuit 45b) illustrated in FIG. 12 has a structure for solving the same problem as that solved by Example 3-2. Hereinafter, an operation of the reference potential control circuit 45b (amplitude control circuit) is described. Note that the same structural element as that in Example 1 is denoted by the same reference symbol and description thereof is omitted. In addition, the power amplifier circuit illustrated in FIG. 12 includes the loop gain control circuit 100 that is the same as that in Example 2 (FIG. 5).

Figure 13:
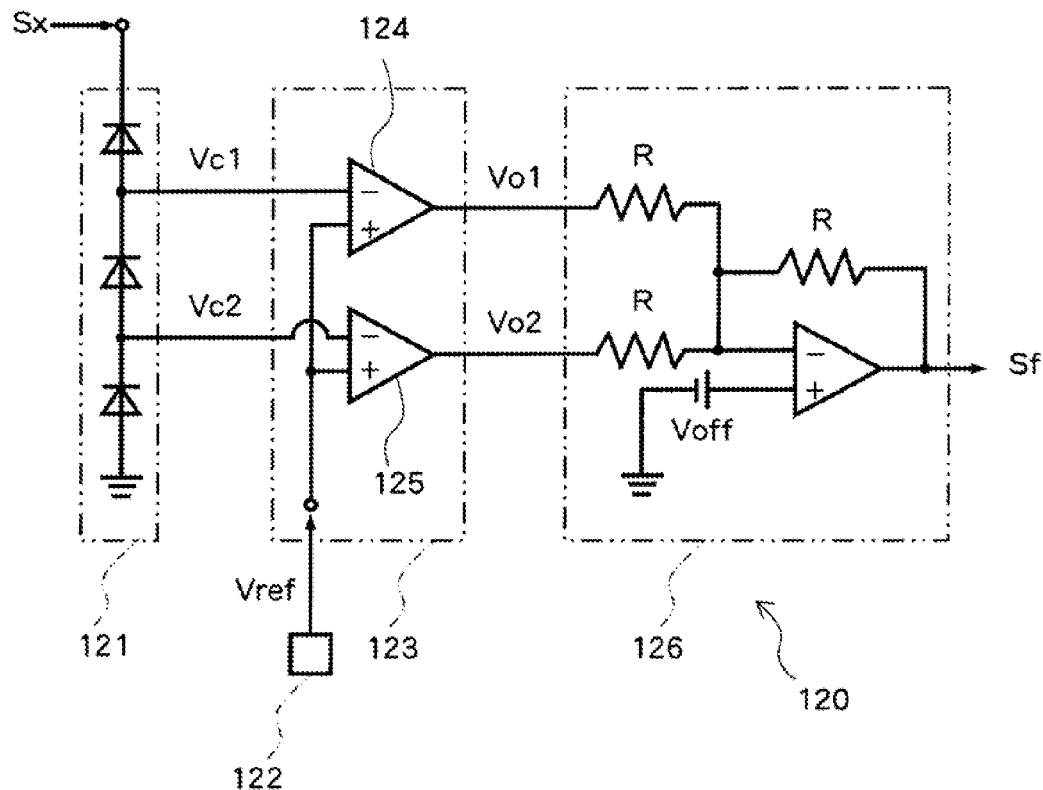
FIG. 13 is a diagram for describing an example of a structure of the reference potential control circuit.

As illustrated in FIG. 12, the reference potential control circuit 45b in this case includes a mixer 101a, a low-pass filter 102a, a subtractor 103a, and a control circuit 120. As described below, the mixer 101a, the low-pass filter 102a, and the subtractor 103a perform operations similar to those of the mixer 101, the low-pass filter 102, and the subtractor 103 included in the loop gain control circuit 100. A signal Su is further distributed from the input signal Si in the power amplifier circuit in this case. The signal Su is divided into two to be supplied to the mixer 101a. The mixer 101a outputs a signal Sv having a DC voltage Va' corresponding to the amplitude of the signal Su. In other words, the DC voltage Va' increases along with an increase of the amplitude of the signal Su and decreases along with a decrease of the amplitude of the signal Su. For instance, the DC voltage Va' is proportional to the amplitude of the signal Su. The low-pass filter 102a attenuates high frequency components and outputs a signal which contains mostly a DC voltage component. The signal Sv in which high frequency components are attenuated by the low-pass filter 102a, and a reference signal Sw having a predetermined DC voltage Vb' are supplied to the subtractor 103a. The subtractor 103a outputs a signal Sx having a DC voltage Vc' satisfying Vc'=Vb'−Va'. If Va'<Vb' is satisfied (i.e., if the amplitude of the input signal Si is smaller than a predetermined amplitude), the DC voltage Vc' of the signal Sx increases along with a decrease of the amplitude of the input signal Si. Note that if Va'≧Vb' is satisfied (i.e., if the amplitude of the input signal Si is larger than or equal to a predetermined amplitude), the DC voltage Vc' of the signal Sx becomes zero. The output signal Sx from the subtractor 103a is supplied to the control circuit 120. The control circuit 120 controls the DC voltage β of the reference signal Sf based on the output signal Sx from the subtractor 103a. As illustrated in FIG. 9, the control circuit 120 controls the DC voltage β of the reference signal Sf so that the DC voltage β of the reference signal Sf decreases step by step along with a decrease of the amplitude of the input signal Si. FIG. 13 is a diagram illustrating an example of a structure for controlling the DC voltage β of the reference signal Sf. As illustrated in FIG. 13, the control circuit 120 includes a voltage division circuit 121, a sample and hold circuit 122, a voltage comparing circuit 123, and an adding circuit 126. The voltage division circuit 121 divides the input DC voltage Vc' as the signal Sx and supplies a voltage Vc1 (Vc1=2*Vc'/3) and a voltage Vc2 (Vc2=Vc'/3) to the voltage comparing circuit 123.

The voltage comparing circuit 123 includes a first comparator 124 and a second comparator 125. The first comparator 124 compares the voltage Vc1 output from the voltage division circuit 121 with a reference voltage Vref supplied from the sample and hold circuit 122, and outputs a voltage Vo1 indicating a result of the comparison. If the voltage Vc1 is higher than the reference voltage Vref, the first comparator 124 outputs an H level voltage (Vhigh). If the voltage Vc1 is not higher than the reference voltage Vref, the first comparator 124 outputs an L level voltage (Vlow). Here, the H level voltage (Vhigh) is set to a predetermined voltage (e.g., the power supply voltage) larger than 0 V, and the L level voltage (Vlow) is set to 0 V. The second comparator 125 compares the voltage Vc2 output from the voltage division circuit 121 with the reference voltage Vref supplied from the sample and hold circuit 122, and outputs a voltage Vo2 indicating a result of the comparison. If the voltage Vc2 is higher than the reference voltage Vref, the second comparator 125 outputs the H level voltage (Vhigh). If the voltage Vc2 is not higher than the reference voltage Vref, the second comparator 125 outputs the L level voltage (Vlow).

The output voltages Vo1 and Vo2 from the first comparator 124 and the second comparator 125 are supplied to the adding circuit 126. Note that three resistors included in the adding circuit 126 illustrated in FIG. 13 have the same resistance value. Therefore, the adding circuit 126 outputs a signal having a voltage obtained by subtracting the sum voltage of the output voltages Vo1 and Vo2 of the first comparator 124 and the second comparator 125 from an offset voltage Voff. This signal is supplied as a reference signal Sf to the subtractor 41. In other words, the reference signal Sf having the DC voltage (Voff−(Vo1+Vo2)) is supplied to the subtractor 41.

Figure 14:
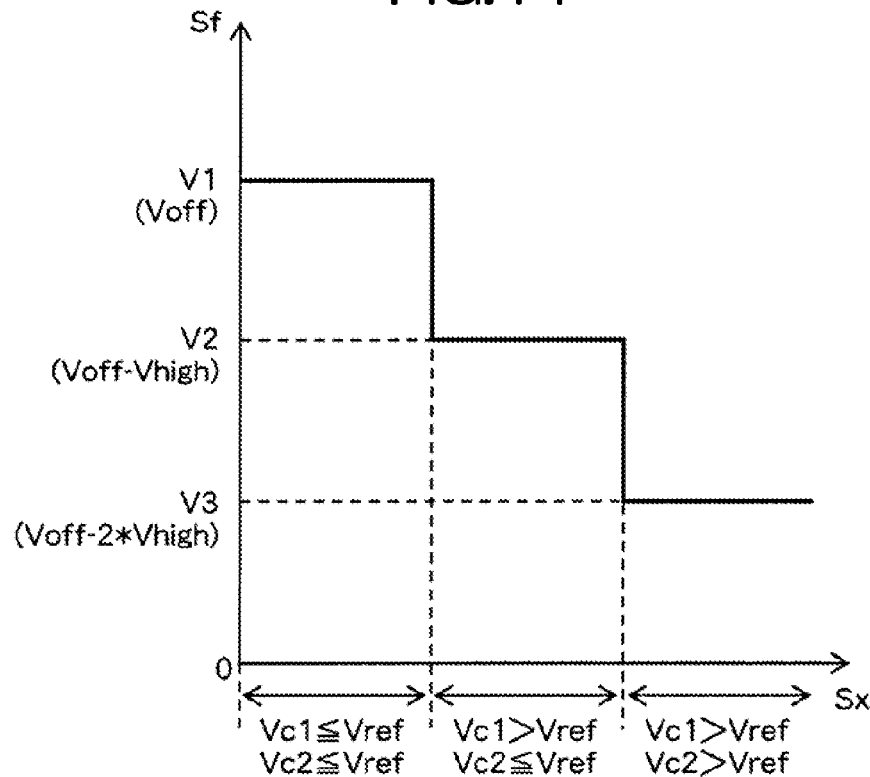
FIG. 14 is a diagram for describing an operation of the reference potential control circuit.

As illustrated in FIG. 14, if both Vo1 and Vc2 are not higher than the reference voltage Vref (i.e., if the L level voltages are supplied from the first comparator 124 and the second comparator 125), the DC voltage β of the reference signal Sf is set to Voff. In addition, if Vo1 is higher than the reference voltage Vref and Vc2 is not higher than the reference voltage Vref (i.e., if the H level voltage is supplied from the first comparator 124 and the L level voltage is supplied from the second comparator 125), the DC voltage β of the reference signal Sf is set to (Voff−Vhigh). Further, if both Vo1 and Vc2 are higher than the reference voltage Vref (i.e., if the H level voltages are supplied from the first comparator 124 and the second comparator 125), the DC voltage β of the reference signal Sf is set to (Voff−2*Vhigh).

For instance, the operation illustrated in FIG. 9 may be realized by setting the reference voltage Vref and the like as follows. If the amplitude of the input signal Si is larger than or equal to X1, both Vo1 and Vc2 are lower than or equal to Vref. If the amplitude of the input signal Si is larger than or equal to X2 and is smaller than X1, Vo1 is higher than Vref, and Vc2 is lower than or equal to Vref. If the amplitude of the input signal Si is smaller than X2, both Vo1 and Vc2 are higher than Vref.

As described above, according to the structure illustrated in FIG. 13, the DC voltage β of the reference signal Sf decreases step by step along with an increase of the DC voltage Vc' input as the signal Sx (i.e., along with a decrease of the amplitude of the input signal Si). As a result, the amplitude of the first constant envelope signal Sd1 and the second constant envelope signal Sd2 decreases step by step along with a decrease of the amplitude of the input signal Si.

In addition, the control circuit 120 controls the first amplifier 11 and the second amplifier 12 based on the output signal Sx from the subtractor 103a so that the operating point of amplifying the first constant envelope signal Sd1 and the second constant envelope signal Sd2 is in the saturation region of the first amplifier 11 and the second amplifier 12. In other words, the control circuit 120 controls the gate voltage or/and the gate width of the first amplifier 11 and the second amplifier 12 in synchronization with a variation of the DC voltage β of the reference signal Sf (i.e., a variation of the amplitude of the first constant envelope signal Sd1 and the second constant envelope signal Sd2). The structure for controlling the gate width of the first amplifier 11 and the second amplifier 12 is realized by, for example, the following structure. In other words, the first amplifier 11 is constituted by connecting a plurality of amplifiers having the same operating point in parallel. The second amplifier 12 is constituted in the same manner. Then, the control circuit 120 selectively turns on and off the plurality of amplifiers included in the first amplifier 11 in synchronization with a variation of the DC voltage β of the reference signal Sf (variation of the amplitude of the first constant envelope signal Sd1 and the second constant envelope signal Sd2), to thereby control the gate width of the first amplifier 11. Similarly, the control circuit 120 selectively turns on and off the plurality of amplifiers included in the second amplifier 12, to thereby control the gate width of the second amplifier 12. In addition, the structure for controlling the gate voltage of the first amplifier 11 and the second amplifier 12 is realized by the structure, for example, which is similar to the structure for controlling the DC voltage β of the reference signal Sf based on the output signal Sx from the subtractor 103a (see FIG. 13). Note that the similar structure may be also used in the reference potential control circuit 45 of Example 3-2, as the structure for controlling the gate voltage of the first amplifier 11 and the second amplifier 12.

Further, the control circuit 120 controls the DC voltage Vb of the reference signal Sm based on the output signal Sx from the subtractor 103a. The control circuit 120 controls the DC voltage Vb of the reference signal Sm so that the DC voltage Vb of the reference signal Sm decreases step by step in synchronization with a step by step decrease of the DC voltage β of the reference signal Sf. The structure for controlling the DC voltage Vb of the reference signal Sm based on the output signal Sx from the subtractor 103a is realized by, for example, the structure similar to the structure for controlling the DC voltage β of the reference signal Sf based on the output signal Sx from the subtractor 103a (see FIG. 13).

According to the power amplifier circuit illustrated in FIGS. 12 and 13, the operation described below is realized.

For instance, if the amplitude of the input signal Si is larger than or equal to a predetermined amplitude X1 (i.e., if both Vc1 and Vc2 are lower than or equal to Vref), the DC voltage β of the reference signal Sf is set to a predetermined voltage V1. In this case, the amplitude of the first constant envelope signal Sd1 and the second constant envelope signal Sd2 becomes a predetermined amplitude B1. In addition, in this case, the gate voltage or the gate width of the first amplifier 11 and the second amplifier 12 is also controlled so as to correspond to the amplitude B1 of the first constant envelope signal Sd1 and the second constant envelope signal Sd2 (i.e., so that the operating point is in the saturation region). In addition, the DC voltage Vb of the reference signal Sm is set so that the phenomenon that "the amplitude of the output signals Sd1 and Sd2 from the first adder 21 and the second adder 22 decreases while maintaining a phase difference between the signals Sd1 and Sd2 constant along with a decrease of the amplitude of the input signal Si" occurs in a case where the amplitude of the input signal Si becomes smaller than X1.

If the amplitude of the input signal Si becomes smaller than X1 in the state set as described above, the amplitude of the output signals Sd1 and Sd2 from the first adder 21 and the second adder 22 decreases while maintaining a phase difference between the signals Sd1 and Sd2 constant along with a decrease of the amplitude of the input signal Si. In this case, the control circuit 120 sets the DC voltage β of the reference signal Sf to a predetermined voltage V2 (V2<V1) so that, when the amplitude of the signals Sd1 and Sd2 becomes a predetermined amplitude B2 (B2<B1), the amplitude of the signals Sd1 and Sd2 becomes constant at B2 (so that the signals Sd1 and Sd2 become constant envelope signals having the amplitude B2). Note that the amplitude of the signals Sd1 and Sd2 varies from B1 to B2 gradually in this case, and hence continuity of the modulated signal is secured. In addition, in this case, the gate voltage or the gate width of the first amplifier 11 and the second amplifier 12 is also controlled so as to correspond to the amplitude B2 of the first constant envelope signal Sd1 and the second constant envelope signal Sd2 (i.e., so that the operating point is in the saturation region). In addition, the DC voltage Vb of the reference signal Sm is set so that the phenomenon that "the amplitude of the output signals Sd1 and Sd2 from the first adder 21 and the second adder 22 decreases while maintaining a phase difference between the signals Sd1 and Sd2 constant along with a decrease of the amplitude of the input signal Si" occurs in a case where the amplitude of the input signal Si becomes smaller than X2 (X2<X1).

If the amplitude of the input signal Si becomes smaller than X2 in the state set as described above, the amplitude of the output signals Sd1 and Sd2 from the first adder 21 and the second adder 22 decreases while maintaining a phase difference between the signals Sd1 and Sd2 constant along with a decrease of the amplitude of the input signal Si. In this case, the control circuit 120 sets the DC voltage β of the reference signal Sf to a predetermined voltage V3 (V3<V2) so that, when the amplitude of the signals Sd1 and Sd2 becomes a predetermined amplitude B3 (B3<B2), the amplitude of the signals Sd1 and Sd2 becomes constant at B3 (so that the signals Sd1 and Sd2 become constant envelope signals having the amplitude B3). Note that the amplitude of the signals Sd1 and Sd2 varies from B2 to B3 gradually in this case, and hence continuity of the modulated signal is secured. In addition, in this case, the gate voltage or the gate width of the first amplifier 11 and the second amplifier 12 is also controlled so as to correspond to the amplitude B3 of the first constant envelope signal Sd1 and the second constant envelope signal Sd2 (i.e., so that the operating point is in the saturation region). In addition, the DC voltage Vb of the reference signal Sm is set so that the phenomenon that "the amplitude of the output signals Sd1 and Sd2 from the first adder 21 and the second adder 22 decreases while maintaining a phase difference between the signals Sd1 and Sd2 constant along with a decrease of the amplitude of the input signal Si" occurs in a case where the amplitude of the input signal Si becomes smaller than X3 (X3<X2).

If the amplitude of the input signal Si becomes larger than or equal to X2 in the state set as described above, the control circuit 120 updates the DC voltage β of the reference signal Sf to V2 so that the amplitude of the signals Sd1 and Sd2 becomes constant at a predetermined amplitude value B2 (so that the signals Sd1 and Sd2 become constant envelope signals having the amplitude B2). Note that in this case, the gate voltage or the gate width of the first amplifier 11 and the second amplifier 12 is also controlled so as to correspond to the amplitude B2 of the first constant envelope signal Sd1 and the second constant envelope signal Sd2 (i.e., so that the operating point is in the saturation region). In addition, the DC voltage Vb of the reference signal Sm is set so that the phenomenon that "the amplitude of the output signals Sd1 and Sd2 from the first adder 21 and the second adder 22 decreases while maintaining a phase difference between the signals Sd1 and Sd2 constant along with a decrease of the amplitude of the input signal Si" occurs in a case where the amplitude of the input signal Si becomes smaller than X2.

If the amplitude of the input signal Si becomes larger than or equal to X1 in the state set as described above, the control circuit 120 updates the DC voltage β of the reference signal Sf to V1 so that the amplitude of the signals Sd1 and Sd2 becomes constant at a predetermined amplitude value B1 (so that the signals Sd1 and Sd2 become constant envelope signals having the amplitude B1). Note that in this case, the gate voltage or the gate width of the first amplifier 11 and the second amplifier 12 is also controlled so as to correspond to the amplitude B1 of the first constant envelope signal Sd1 and the second constant envelope signal Sd2 (i.e., so that the operating point is in the saturation region). In addition, the DC voltage Vb of the reference signal Sm is set so that the phenomenon that "the amplitude of the output signals Sd1 and Sd2 from the first adder 21 and the second adder 22 decreases while maintaining a phase difference between the signals Sd1 and Sd2 constant along with a decrease of the amplitude of the input signal Si" occurs in a case where the amplitude of the input signal Si becomes smaller than X1.

According to the power amplifier circuit illustrated in FIG. 12, similarly to Example 3-2, it is possible to control so that a phase difference between the first constant envelope signal Sd1 and the second constant envelope signal Sd2 does not become too large even if the amplitude of the input signal Si decreases. In other words, it is possible to control the phase error of the output signal So to be small even if the amplitude of the input signal Si becomes small. As a result, it is possible to amplify preferably a signal following a modulation method with large dynamic range. Further, it is possible to secure amplification with high power added efficiency.

In addition, also in the power amplifier circuit illustrated in FIG. 12, similarly to Example 3-2, the gain of the loop part for amplifying the fundamental signal for conversion Sb may be controlled based on the amplitude of the input signal Si so that the amplitude of the first constant envelope signal Sd1 and the second constant envelope signal Sd2 decreases step by step. For instance, at least one gain of the first adder 21, the second adder 22, the subtractor 41, the variable gain amplifier 42, the buffer amplifier 44, and the mixer 51 may be controlled based on the amplitude of the input signal Si so that the amplitude of the first constant envelope signal Sd1 and the second constant envelope signal Sd2 decreases step by step. Note that if the method of controlling the DC voltage β of the reference signal Sf is adopted as in this embodiment, it may be realized relatively easily and preferably that the amplitude of the first constant envelope signal Sd1 and the second constant envelope signal Sd2 decreases step by step along with a decrease of the amplitude of the input signal Si.

In addition, in this example, the DC voltage β of the reference signal Sf, the DC voltage Vb of the reference signal Sm, the first amplifier 11, and the second amplifier are controlled based on the output signal Sx of the subtractor 103a. However, the DC voltage β of the reference signal Sf, the DC voltage Vb of the reference signal Sm, the first amplifier 11, and the second amplifier may be controlled based on the output signal Sv from the mixer 101a, for example. Note that the signal Sk in which high frequency components are attenuated by the low-pass filter 102 may be distributed to the subtractor 103 and the subtractor 103a, for example. In this case, the mixer 101a and the low-pass filter 102a may be eliminated.

[Example 6 of Embodiment]

Figure 15:
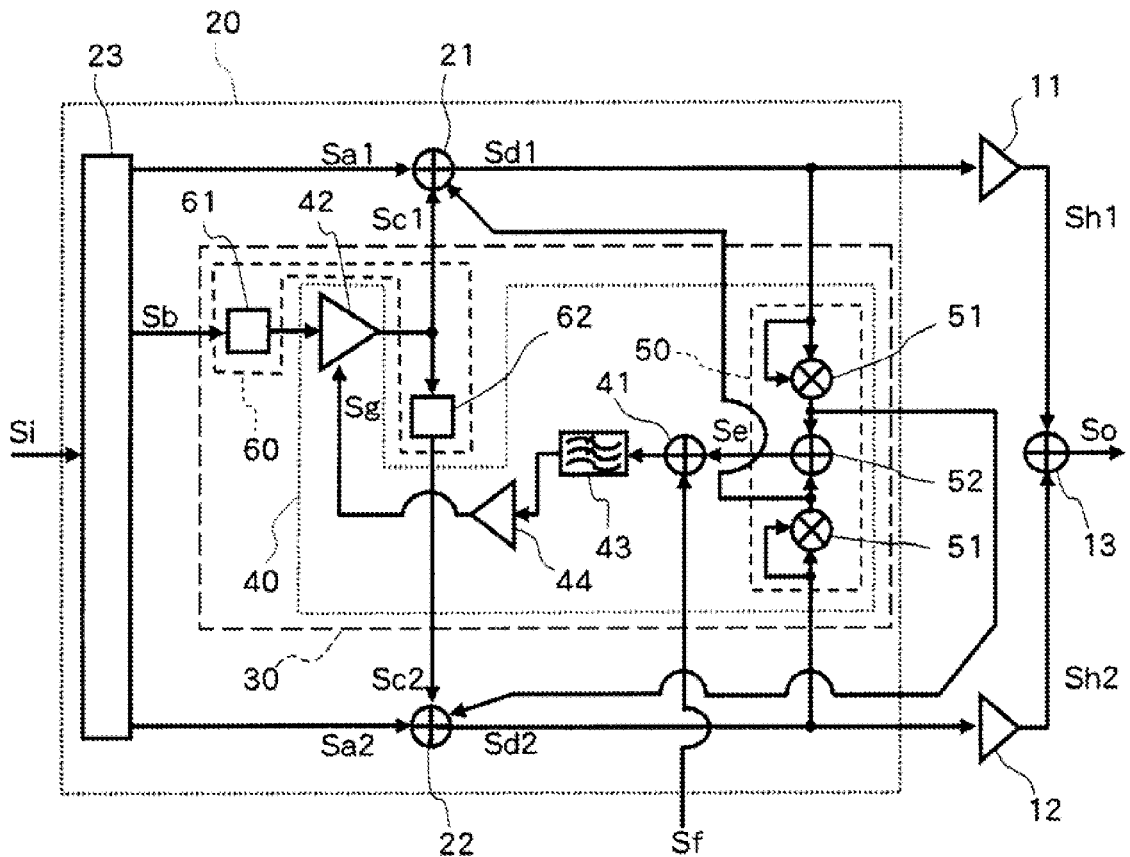
FIG. 15 is a circuit diagram illustrating schematically still another example of the power amplifier circuit according to the embodiment of the present invention.

FIG. 15 is a circuit diagram illustrating schematically another example of the power amplifier circuit according to the embodiment of the present invention. Note that only points different from Example 1 described above are described in this example, and similar structural elements are denoted by the same reference symbols so that overlapping descriptions are omitted.

The power amplifier circuit of this example has the structure in which a part of the output signal from the mixer 51 to which a part of the first constant envelope signal Sd1 is supplied is added to the drive current of the second adder 22, and a part of the output signal from the mixer 51 to which a part of the second constant envelope signal Sd2 is supplied is added to the drive current of the first adder 21.

According to the power amplifier circuit of this example, the amplitude of the output signal from the second adder 22 increases along with an increase of the amplitude of the first constant envelope signal Sd1, and the amplitude of the output signal from the first adder 21 increases along with an increase of the amplitude of the second constant envelope signal Sd2. As a result, if a difference occurs between the amplitude of the first constant envelope signal Sd1 and the amplitude of the second constant envelope signal Sd2 due to a variation or the like of performances of the first adder 21 and the second adder 22, the difference may be decreased.

[Example 7 of Embodiment]

Figure 16:
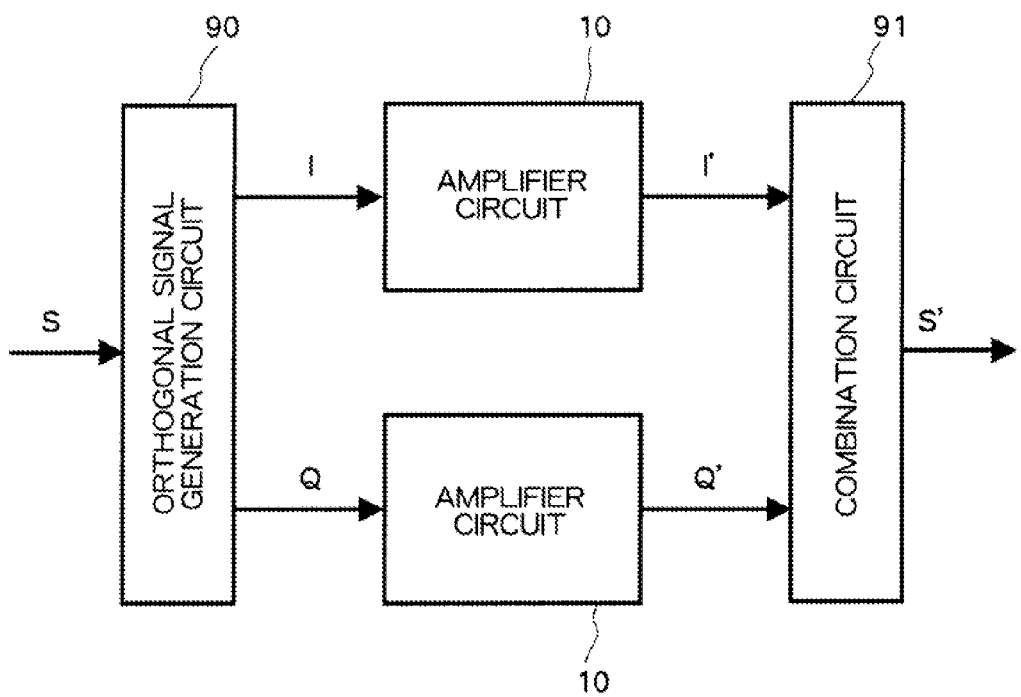
FIG. 16 is a block diagram illustrating schematically an example of an embodiment of a composite amplifier circuit using the power amplifier circuit according to the embodiment of the present invention.

FIG. 16 is a block diagram illustrating schematically an example of forming a composite amplifier circuit using two power amplifier circuits according to the embodiment of the present invention.

The composite amplifier circuit of this example includes an orthogonal signal generation circuit 90, two power amplifier circuits 10, and a combination circuit 91. The orthogonal signal generation circuit 90 converts the input signal S having envelope variation into two orthogonal signals I and Q having envelope variation. The power amplifier circuit 10 is the power amplifier circuit according to the embodiment of the present invention, which converts the orthogonal signals I or Q having envelope variation into two constant envelope signals, respectively, and amplifies and then recombines the constant envelope signals, so as to output amplified orthogonal signals I' or Q' having envelope variation. The combination circuit 91 combines the amplified orthogonal signals I' and Q' having envelope variation so as to generate an output signal S' having envelope variation.

According to the composite amplifier circuit of this example, it is possible to perform amplification by directly utilizing IQ signals which are often used in communication devices.

[Example 8 of Embodiment]

Figure 17:
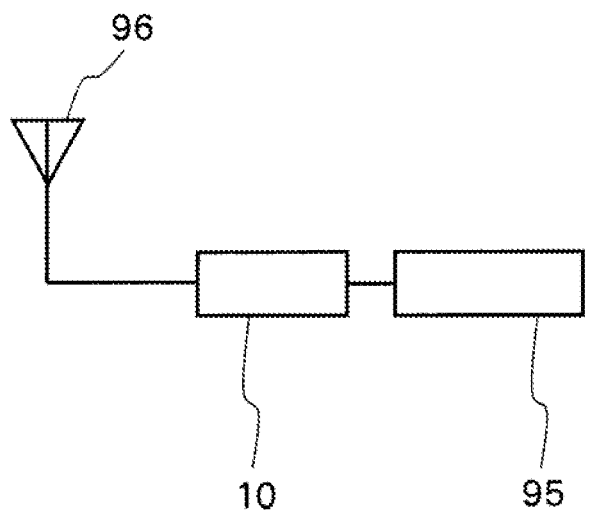
FIG. 17 is a block diagram illustrating schematically an example of an embodiment of a transmitter using the power amplifier circuit according to the embodiment of the present invention.

FIG. 17 is a block diagram illustrating schematically an example of forming a transmitter using the power amplifier circuit according to the embodiment of the present invention.

In the transmitter of the present invention, an antenna 96 is connected to a transmission circuit 95 via the power amplifier circuit 10 according to the embodiment of the present invention.

According to the transmitter according to the embodiment of the present invention, the transmission signal having envelope variation from the transmission circuit may be amplified by the power amplifier circuit 10 according to the embodiment of the present invention with low power consumption and high power added efficiency. Therefore, it is possible to provide a transmitter with low power consumption and long transmission time.

[Example 9 of Embodiment]

Figure 18:
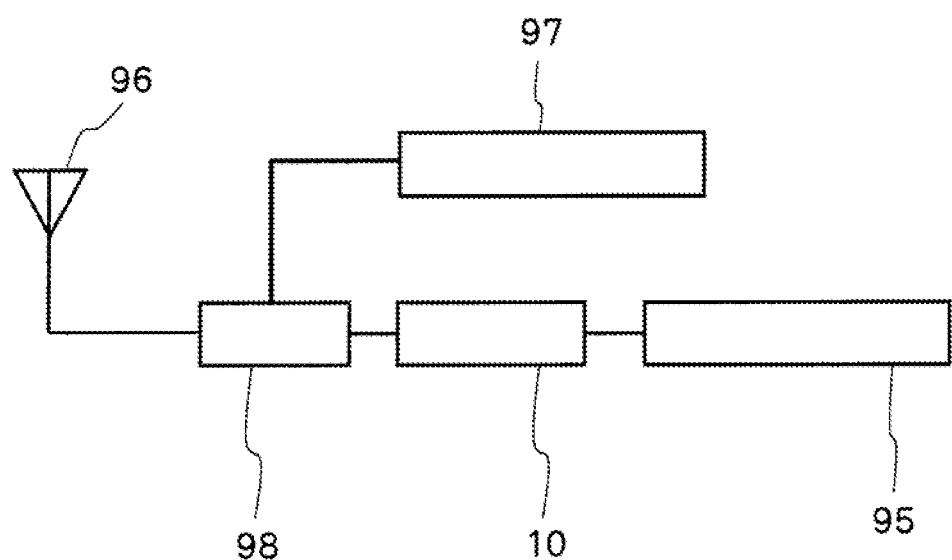
FIG. 18 is a block diagram illustrating schematically an example of an embodiment of a wireless communication device using the power amplifier circuit according to the embodiment of the present invention.

FIG. 18 is a block diagram illustrating schematically an example of forming a wireless communication device using the power amplifier circuit according to the embodiment of the present invention.

In the wireless communication device according to the embodiment of the present invention, the antenna 96 is connected to the transmission circuit 95 via the power amplifier circuit 10 according to the embodiment of the present invention, and a reception circuit 97 is connected to the antenna. In addition, a switch circuit 98, which switches between transmission and reception, is inserted between the antenna 96, and the transmission circuit 95 as well as the reception circuit 97.

According to the wireless communication device according to the embodiment of the present invention, the transmission signal having envelope variation from the transmission circuit may be amplified by the power amplifier circuit 10 according to the embodiment of the present invention with low power consumption and high power added efficiency. Therefore, it is possible to provide a wireless communication device with low power consumption and long communication time.

[Variation Examples]

The present invention is not limited to Examples 1 to 9 of the embodiment described above, and may be modified or improved variously without deviating from the spirit of the present invention.

For instance, the examples of the embodiment described above illustrates examples in which the low-pass filter 43 and the buffer amplifier 44 are used. However, it is possible to use an operational amplifiers instead of these.

In addition, in the examples of the embodiment described above, the distributed signal for conversion Sb is amplified by the variable gain amplifier 42 after being advanced in phase by $\pi/2$ by the phase shifter 61 which constitutes a part of the phase shifting circuit 60. The signal amplified by the variable gain amplifier 42 is divided into two. One of them is supplied as the first converted signal Sc1 to the first adder 21, and the other is supplied as the second converted signal Sc2 to the second adder 22 after being advanced in phase by $\pi$ by the phase shifter 62 which constitutes a part of the phase shifting circuit 60. However, the distributed signal for conversion Sb may, for example, be divided into two after being advanced in phase by $\pi/2$ by the phase shifter. Then, the two signals may be respectively amplified by the variable gain amplifiers after one of them is advanced in phase by $\pi$ by the phase shifter, to thereby generate the first converted signal Sc1 and the second converted signal Sc2.

Further, in the examples of the embodiment described above, the mixer 51 is used for detecting the amplitude of the first constant envelope signal Sd1 and the second constant envelope signal Sd2. However, it is possible to use a diode detector, for example, instead of the mixer 51.

Still further, in the examples of the embodiment described above, the phase shifter 61 for advancing a phase by $\pi/2$ and the phase shifter 62 for advancing a phase by $\pi$ are used as the phase shifting circuit 60. Alternatively, the phase shifter 62 for advancing a phase by $\pi$ may be eliminated by outputting a differential signal from the variable gain amplifier 42, for example. In addition, it is possible to distribute the input signal Si having envelope variation into the first distributed signal Sa1 and the second distributed signal Sa2 by using a first power distributor, and then further to extract the first and second distributed signals for conversion from each of them by using second and third power distributors. After that, one of them may be advanced in phase by $\pi/2$, and the other may be delayed in phase by $\pi/2$. Then, the signals may be amplified by first and second variable gain amplifiers so that the first converted signal Sc1 and the second converted signal Sc2 are generated. In this case, the first to the third power distributors correspond to the power distributor 23 of the embodiment of the present invention. In this way, as a concrete circuit, there may be various variations.

The invention claimed is:

1. A power amplifier circuit, comprising:
a constant envelope signal generation circuit for converting an input signal having envelope variation into a first constant envelope signal and a second constant envelope signal which have the same amplitude and different phases so as to output the first constant envelope signal and the second constant envelope signal;
a first amplifier for amplifying the first constant envelope signal, which is input from the constant envelope signal generation circuit, so as to output a first amplified signal;
a second amplifier for amplifying the second constant envelope signal, which is input from the constant envelope signal generation circuit, so as to output a second amplified signal; and
an output adder for outputting an amplified output signal having envelope variation based on the first amplified signal, which is input from the first amplifier, and the second amplified signal, which is input from the second amplifier,
wherein the constant envelope signal generation circuit includes an amplitude control circuit for controlling the amplitude of the first constant envelope signal and the second constant envelope signal based on an amplitude of the input signal wherein the constant envelope signal generation circuit includes:
a fundamental signal generation circuit for generating a first fundamental signal and a second fundamental signal having the same amplitude and predetermined phase relationships with the input signal, and a fundamental signal for conversion having constant phase relationships with the first fundamental signal and the second fundamental signal, from the input signal having envelope variation;
a converted signal generation circuit for generating a first converted signal which has an amplitude Y satisfying $Y^2=A^2-X^2$, where X denotes the amplitude of the first fundamental signal and the second fundamental signal, and A denotes any constant amplitude larger than X, and which is advanced in phase with respect to the first fundamental signal by $\pi/2$, and a second converted signal which has the amplitude Y and is delayed in phase with respect to the second fundamental signal by $\pi/2$, by amplifying the fundamental signal for conversion based on the amplitude X of the first fundamental signal and/or the second fundamental signal;
a first adder for performing vector addition of the first fundamental signal and the first converted signal; and
a second adder for performing vector addition of the second fundamental signal and the second converted signal, wherein the first constant envelope signal is output based on a signal output from the first adder, and the second constant envelope signal is output based on a signal output from the second adder, and
wherein the amplitude control circuit controls a gain of generating the first converted signal and the second converted signal, so as to control the amplitude of the first constant envelope signal and the second constant envelope signal,
wherein the converted signal generation circuit includes:
an amplitude detection signal generation circuit for generating an amplitude detection signal having a DC voltage $\alpha$ corresponding to an amplitude of a signal obtained by vector addition of the first fundamental signal and the first converted signal, and a signal obtained by vector addition of the second fundamental signal and the second converted signal;
a subtractor for outputting, in a case where a reference signal having any DC voltage $\beta$ larger than the DC voltage $\alpha$ and the amplitude detection signal are input, a signal having a DC voltage $\gamma$ satisfying $\gamma=\beta-\alpha$; and
a variable gain amplifier for amplifying the fundamental signal for conversion, based on a gain control signal based on the signal output from the subtractor, so that the amplitude Y of the first converted signal and the second converted signal satisfies $Y^2=A^2-X^2$, and
wherein the amplitude control circuit controls the DC voltage $\beta$ of the reference signal based on the amplitude of the input signal so as to control the amplitude of the first constant envelope signal and the second constant envelope signal.

2. The power amplifier circuit according to claim 1, wherein the amplitude control circuit controls the amplitude of the first constant envelope signal and the second constant envelope signal so that the amplitude of the first constant envelope signal and the second constant envelope signal decreases step by step as the amplitude of the input signal decreases.

3. A transmitter comprising a transmission circuit and an antenna which are connected via the power amplifier circuit according to claim 2.

4. A wireless communication device comprising a transmission circuit and an antenna which are connected via the power amplifier circuit according to claim 2 and a reception circuit connected to the antenna.

5. The power amplifier circuit according to claim 1, further comprising a circuit for controlling the first amplifier and the second amplifier, in synchronization with a variation of the amplitude of the first constant envelope signal and the second constant envelope signal, so that an operating point of amplifying the first constant envelope signal and the second constant envelope signal is in a saturation region.

6. A transmitter comprising a transmission circuit and an antenna which are connected via the power amplifier circuit according to claim 5.

7. A wireless communication device comprising a transmission circuit and an antenna which are connected via the power amplifier circuit according to claim 5 and a reception circuit connected to the antenna.

8. A transmitter comprising a transmission circuit and an antenna which are connected via the power amplifier circuit according to claim 1.

9. A wireless communication device comprising a transmission circuit and an antenna which are connected via the power amplifier circuit according to claim 1, and a reception circuit connected to the antenna.

* * * * *